United States Patent
Hofmann et al.

(10) Patent No.: US 6,767,614 B1
(45) Date of Patent: Jul. 27, 2004

(54) MULTIPLE-LEVEL ACTUATORS AND CLAMPING DEVICES

(75) Inventors: Wolfgang M. J. Hofmann, 7 Denton House, Halton Road, London N1 2AE (GB); Hercules Neves, Ithaca, NY (US); Noel C. MacDonald, 1365 Camino Manadero, Santa Barbara, CA (US) 93111; Scott G. Adams, Ithaca, NY (US)

(73) Assignees: Wolfgang M. J. Hofmann, Munich (DE); Noel C. MacDonald, Santa Barbara, CA (US)

( * ) Notice: Subject to any disclaimer, the term of this patent is extended or adjusted under 35 U.S.C. 154(b) by 0 days.

(21) Appl. No.: 10/021,311

(22) Filed: Dec. 19, 2001

Related U.S. Application Data

(60) Provisional application No. 60/256,358, filed on Dec. 19, 2000.

(51) Int. Cl.⁷ .............................. B32B 3/00; B32B 3/20; B32B 3/10
(52) U.S. Cl. ...................... 428/166; 428/34.1; 428/131; 428/188
(58) Field of Search ................................ 428/131, 166, 428/188, 34.1

(56) References Cited

U.S. PATENT DOCUMENTS

| | | |
|---|---|---|
| 5,198,390 A | 3/1993 | MacDonald et al. |
| 5,199,917 A | 4/1993 | MacDonald et al. |
| 5,235,187 A | 8/1993 | Arney et al. |
| 5,287,082 A | 2/1994 | Arney et al. |
| 5,316,979 A | 5/1994 | MacDonald et al. |
| 5,363,021 A | 11/1994 | MacDonald |
| 5,375,033 A | 12/1994 | MacDonald |
| 5,393,375 A | 2/1995 | MacDonald et al. |
| 5,399,415 A | 3/1995 | Chen et al. |
| 5,436,070 A | 7/1995 | Schroer et al. |
| 5,449,903 A | 9/1995 | Arney et al. |
| 5,498,312 A | 3/1996 | Laermer et al. |
| 5,501,893 A | 3/1996 | Laermer et al. |
| 5,506,175 A | 4/1996 | Zhang et al. |
| 5,546,988 A | 8/1996 | Perkey et al. |
| 5,563,343 A | 10/1996 | Shaw et al. |

(List continued on next page.)

OTHER PUBLICATIONS

MacDonald, N.C.; SCREAM Microelectromechanical systems; Microelectronic Engineering, vol. 32, pp. 49–73, Sep. 1996.

Jazairy, A., MacDonald, N.C.; Planar very high aspect ratio microstructures for large loading forces; Microelectronic Engineering, vol. 30, pp. 527–530, Jan. 1996.

Zhang, Z.L., MacDonald, N.C.; A RIE process for submicron, silicon electromechanical structures, J. Micromechanical & Microengineering, vol. 2, pp. 31–38, Mar. 1992.

(List continued on next page.)

*Primary Examiner*—Harold Pyon
*Assistant Examiner*—Patricia L. Nordmeyer
(74) *Attorney, Agent, or Firm*—Jones, Tullar & Cooper, PC

(57) ABSTRACT

Improved fabrication processes for microelectromechanical structures, and unique structures fabricated by the improved processes are disclosed. In its simplest form, the fabrication process is a modification of the know SCREAM process, extended and used in such a way as to produce a combined vertical etch and release RIE process, which may be referred to as a "combination etch". Fabrication of a single-level micromechanical structure using the process of the present invention includes a novel dry etching process to shape and release suspended single crystal silicon elements, the process combining vertical silicon reactive ion etching (Si-RIE) and release etches to eliminate the need to deposit and pattern silicon dioxide mask layers on the sides of suspended structures and to reduce the mechanical stresses in suspended structures caused by deposited silicon dioxide films.

31 Claims, 26 Drawing Sheets

U.S. PATENT DOCUMENTS

| | | | |
|---|---|---|---|
| 5,610,335 A | 3/1997 | Shaw et al. | |
| 5,627,427 A | 5/1997 | Das et al. | |
| 5,628,917 A | 5/1997 | MacDonald et al. | |
| 5,637,539 A | 6/1997 | Hofmann et al. | |
| 5,640,133 A | 6/1997 | MacDonald et al. | |
| 5,846,849 A | 12/1998 | Shaw et al. | |
| 5,847,454 A | 12/1998 | Shaw et al. | |
| 5,856,722 A | 1/1999 | Haronian et al. | |

OTHER PUBLICATIONS

Arney, S.C., MacDonald, N.C.; Formation of submicron silicon–on–insulator structures by lateral oxidation of substrate–silicon islands, J. of Vacuum Science & Technology B (Microelectronics Processing & Phenomena, vol. 6, pp. 341–345, Jan.–Feb. 1988.

Shaw, K.A., Zhang, Z.L., MacDonald, N.C.; SCREAM I: a single mask, single crystal silicon, reactive ion etching process for microelectromechanical structures; Sensors & Actuators A (Physical); vol. A40, pp. 63–70, Jan. 1994.

Chen, L.–Y., MacDonald, N.C.; Surface micromachined multiple level tungsten microstructures; Technical Digest Solid–State Sensor & Actuator Workshop; pp. 99–102, 1994.

Hofmann, W., Lee, C.S., MacDonald, N.C.; Monolithic three–dimensional single–crystal silicon microelectromechanical systems; Sensors & Materials, vol. 10, pp. 337–350, 1998.

Shaw, K. A., MacDonald, N.C.; Integrating SCREAM micromachined devices with integrated circuits; Proceedings of Ninth International Workshop on Micro Electromechanical Systems, pp. 44–48, 1996.

Howe, R.T., Boser, B.E., Pisano, A.P.; Polysilicon integrated microsystems: technologies and applications; Sensors & Actuators A, vol. 56, pp. 167–177, 1996.

Rodgers, M.S., Sniegowski, J.J.; 5–Level Polysilicon Surface Micromachine Technology: Application to Complex Mechanical Systems; Solid–State Sensor & Actuator Workshop, Hilton Head Island, SC, 1998.

Ayon, A.A., Lin, C.C., Braff, R.A. and Schmidt, M.A.; Etching Characteristics and Profile Control in a Time Multiplexed Inductively Couples Plasma Etcher; Solid–State Sensor and Actuator Workshop, Hilton Head, SC, 1998.

Ayon, A.A., Braff, R., Lin. C.C., Sawin, H.H., Schmidt, M.A.; Characterization of a Time Mulitplexed Inductively Coupled Plasma Etcher; J. Electrochemical Society, vol. 146, pp. 339–349, 1999.

MacDonald, N.C., Hofmann, W., Chen, L.–Y., Das, J.H.; Micro–machined Electron Gun Arrays (MEGA); Proceedings of SPIE, Intl. Soc. Optical Engineering; vol. 2522, pp. 220–229, 1995.

Hofmann, W., Chen, L.–Y., Das, J.H., MacDonald, N.C.; Micromachined Field Emission Devices; Microelectronic Engineering, vol. 30, pp. 523–526, Jan. 1996.

Das, J.H.; MacDonald, N.C.; Micromachined field emission cathod with an integrated heater; J. Vacuum Science & Technology B (Microelectronics & Nanometer Structures), vol. 13, pp. 2432–2435, Nov.–Dec. 1995.

Spallas, J.P., Das, J.H., MacDonald, N.C.; Self–Aligned silicon field emission cathode rays formed by selective, lateral thermal oxidation of silicon; J. Vacuum Science & Technology B (Microelectronics Processing & Phenomena) vol. 11, pp. 437–440, Mar.–Apr. 1993.

Zhang, Z.L., MacDonald, N.C.; Integrated silicon process for microdynamic vacuum field emission cathodes, J. Vacuum Science & Technology B (Microelectronics Processing & Phenomena) vol. 11, pp. 2538–2543, Nov.–Dec. 1993.

Hofmann, W., Chen, L.–Y., Das, J.H., MacDonald, N.C.; Micromachined Field Emission Devices; Microelectronic Engineering, vo. 30, pp. 523–526, Jan. 1996.

Das, J.H., MacDonald, N.C.; Micromachined field emission cathode with an integrated heater; J. Vacuum Science & Technology B (Microelectronics and Nanometer Structures), vol. 13, pp. 2432–2435, Nov.–Dec. 1995.

Chang, T.H.P.k Kern, D.P., Muray, L.P.; Microminiaturization of electron optical systems; J. Vacuum Science & Technology B, vol. 8, pp. 1698–1705, 1990.

Chang, T.H.P., Kern, D.P., McCord, M.A., Muray, L.P.; A Scanning Tunneling Microscope Controlled Field Emission Microprobe System; J. Vacuum Science & Technology, vol. 9, pp. 438–443, 1991.

Thompson, M.G.R., Chang, T.H.P., Lens and Deflector Design for Microcolumns; J. Vacuum Science & Technology B, vol. 13, pp. 2445–2449, 1995.

Xu, Y., MacDonald, N.C., Miller, S.A.; Integrated Micro–scanning tunneling microscope; Applied Physics Letters, vol. 67, pp. 2305–2307, Oct. 16, 1995.

Saif, M.T.A., MacDonald, N.C.; Design Considerations for Large MEMS, Proceedings of SPIE—Intl. Society of Optical Engineering, vol. 2448, pp. 93–104, 1995.

Xu, Y., Miller, S.A.; MacDonald, N.C.; Microelectromechanical Scanning Tunneling Microscope; Proceedings of International Solid–State Sensors & Actuators Conference—Tranducers '95, pp. 640–643, vol. 1, 1995.

Miller, S.A., MacDonald, N.C., Turner, K.L., Microelectromechanical Scanning Probe Instruments for Array Architectures, Rev. Sci. Instrum. vol. 68, pp. 4155–4162, Nov. 1997.

Prasad, R., MacDonald, N.C., Taylor, D., Micro–Instrumentation for Tribological Measurement, presented at Transducers '95, Stockholm, Sweden, 1995.

Macdonald, N.C., Jazairy, A., Single Crystal Silicon: application to micro–opto–electromechanical devices, Proceedings of SPIE—Intl Soc. for Optical Engineering; vol. 2383, pp. 125–135, 1995.

Haronian, D.; Direct Integration (DI) of Solid State Stress Sensors with Single Crystal Micro–Electro–Mechanical Systems for Integrated Displacement Sensing; Proceedings of Eleventh International Workshop on Micro Electromechanical Systems; Orlando, FL, 1999.

Lee, C.S., Han, S., MacDonald, N.C., Multiple Depth, Single Crystal Silicon MicroActuators for Large Displacement Fabricated by Deep Reactive Ion Etching; Solid–State Sensor & Actuator Workshop, Hilton Head Island, SC, 1998.

Saif, M.T.A., MacDonald, N.C., A Millinewton Microloading Device, Proceedings of the International Solid–State Sensors & Actuators Conference—Tranducers '95, pp. 60–63 vol. 2, 1995.

Adams, S.G., Bertsch, F.M., Shaw, K.A., Hartwell, P.G., Moon, F.C., and MacDonald N.C.; Capacitance based Tunable Micromechanical Resonators; Proceedings of the Intl. Solid State Sensors & Actuators Conference—Transducers '95, pp. 438–441, vol. 1, 1995.

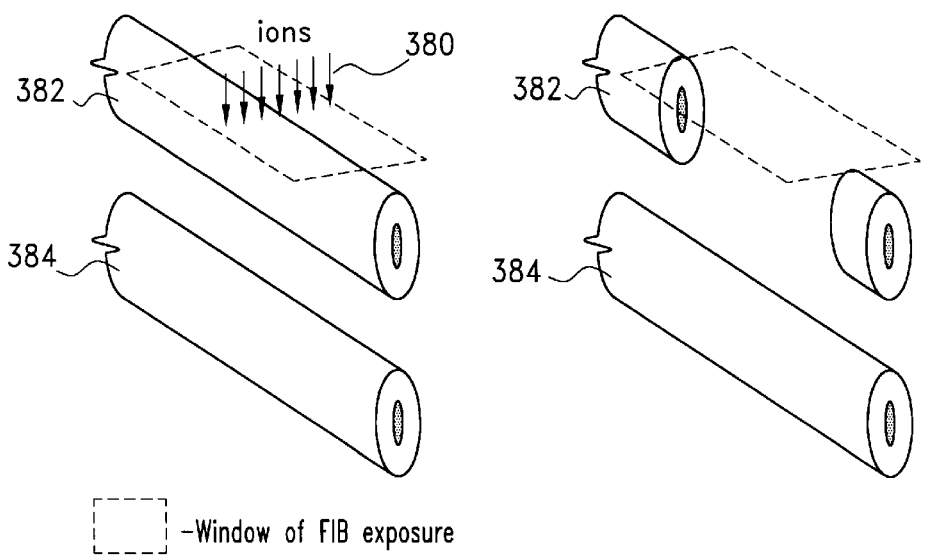
FIG.14(a)
−Upper Level
before
FIG.14(b)
−Upper Level
after
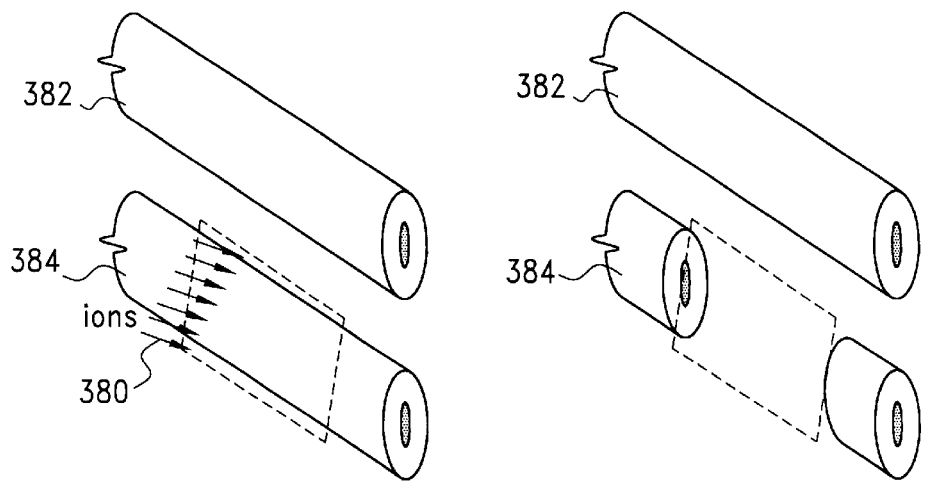
FIG.15(a)
−Lower Level
FIG.15(b)
−Lower Level Comparison of multiple-level actuator designs
Normalized force vs. displacement
for design (a) ○, design (b) △, and design (e) ×

Comparison of push - and pull - modes
of a bi-directional actuator (design (b))

Normalized force vs. displacement
for a two-level bistable system
—electrode bias conditions Normalized force vs. displacement
for a two-level bistable system
—force vs. displacement Potential energy vs. displacement for the spring-actuator system
(the dotted line is for no-applied force)

Multiple-level Clamp-Alignment concept
for the spring-actuator system
-self-aligned initial position - no displacement of levels Multiple-level Clamp-Alignment concept
for the spring-actuator system
-relative displacement and alignment of fiber Lateral instability in comb-drive actuators
—moving finger aligned at center — $F_L=0$ Lateral instability in comb-drive actuators
—moving finger off center

MULTIPLE-LEVEL ACTUATORS AND CLAMPING DEVICES

This application claims the benefit of Provisional Application No. 60/256,358, filed Dec. 19, 2000, the disclosure of which is hereby incorporated herein by reference.

BACKGROUND OF THE INVENTION

The present invention relates, in general, to a novel process for the fabrication of suspended high-aspect-ratio single crystal silicon microstructures. More particularly, the invention relates to two-, three- or more level, high-aspect-ratio, released, or suspended, single crystal silicon microstructures of complex geometries, wherein all levels are self-aligned and fabricated from a single silicon wafer, and to the isolation of or removal of selected suspended microstructures.

Interest in the fabrication of suspended microstructures has increased with the increased use of microelectromechanical systems (MEMS). Many MEMS implementations are fabricated by surface micromachining of deposited thin films, by bulk micromachining of (usually silicon) substrates, or by deep etching, as used in the Single Crystal Reactive Etching and Metallization (SCREAM) process, which is explained for example, in U.S. Pat. No. 5,198,390. As described in this patent, the SCREAM process produces a single level of suspended microstructures. Multiple level SCREAM microstructures must use multiple substrates bonded together, and most other prior techniques for fabricating multiple level structures require the assembly and alignment of numerous separately fabricated components. However, such assemblies are impractical for large arrays of micron-scale structures, and in particular for electron lenses and similar devices, where alignment is critical.

Another process for micromachining silicon substrates for fabricating microelectromechanical devices is exemplified by the process described in U.S. Pat. No. 5,501,893 to Laermer, et al. In this patent, an anisotropic plasma etching of silicon through a mask is used to provide laterally defined recesses in a substrate. The etching step is alternated with a polymerizing step which covers silicon surfaces exposed by the etching step to provide an etching stop, which prevents etching of those surfaces in a subsequent etch step. The alternating etching and protecting steps allow high anisotropy of the etched structure.

Although these processes have been successful, new technical demands have emerged for MEMS fabrication technology; in particular, the integration of MEMS with active electronics on the same chip, and the development of more complex microsystems. There is a need, therefore, for a process which will facilitate fabrication of single and multiple levels of released or suspended microstructures from a single substrate, and in particular will facilitate the fabrication of large arrays of these structures.

SUMMARY OF THE INVENTION

Briefly, the present invention is directed to improved fabrication processes for microelectromechanical structures, and to unique structures fabricated by the improved processes. In its simplest form, the invention is directed to a fabrication process which is based on both the method described, for example, in U.S. Pat. No. 5,501,893 to Laermer et al (hereafter Laermer et al) the disclosure of which is hereby incorporated herein by reference, and on the SCREAM process described, for example, in U.S. Pat. No. 5,198,390, the disclosure of which is hereby incorporated herein by reference. These processes are modified and extended and are used in such a way as to produce a combined vertical etch and release RIE process, which may be referred to herein as a "combination etch".

Fabrication of a single-level micromechanical structure using the process of the present invention includes a novel dry etching process to shape and release suspended single crystal silicon elements, in a single dry etch step. This new process combines vertical silicon reactive ion etching (Si-RIE) and release etches to eliminate the need to deposit and pattern silicon dioxide mask layers on the sides of suspended structures, as is required in the SCREAM process. It furthermore reduces the mechanical stresses in suspended structures caused by deposited silicon dioxide films.

Briefly, the combined process includes formation of a mask structure on the surface of a silicon substrate, for example, through conventional photolithography. Thereafter, the silicon is etched through the mask using an anisotropic vertical reactive ion etching (RIE) plasma etching process using a sequence of etch and passivation cycles as described by Laermer et al. A short quasi-isotropic Si-RIE is followed by a polymerization step which conformally coats the exposed surfaces with a passivation layer. Thereafter, a second anisotropic etching step is carried out which first removes the polymer coating from the horizontal surfaces of the substrate by sputter etching, but not from the vertical surfaces, and then etches the exposed silicon quasi-isotropically. These alternating steps are repeated to produce deep structures (or trenches) having vertical edges, with the profile of the structure being determined by the balance between the passivation and etching steps.

When the desired structure depth has been reached, the structure may be released from the substrate by adjusting the length of and balance between the passivation and etching steps. A long polymerization deposits a thicker passivation layer, followed by a longer Si-RIE step which undercuts the structure to release it. This process integrates the release of suspended structures with the vertical etch that defines them, and is much simpler than prior deep etching fabrication process sequences. It allows the fabrication of delicate structures by reducing mechanical stresses in them, due to the absence of stress-inducing sidewall passivation layers and by avoiding any wet process steps which could deform the suspended structures. The process is particularly suitable for integration with active sensing devices.

In accordance with this aspect of the invention, silicon suspended structures may be produced on a single crystal silicon (SCS) substrate, or wafer, which may contain prefabricated active devices, utilizing only four steps: (1) a photolithography step which defines the layout of the suspended structures and surrounding trenches in a resist layer on the substrate; (2) a first etching step in which the pattern is transferred to the field and inter-layer dielectrics are etched in an anisotropic RIE step; (3) a second etching step in which high aspect ratio SCS suspended structures are etched and released in a single combined etch, and (4) a final step in which the photoresist is removed. The sidewall silicon dioxide film deposition and etchback utilized in prior processes such as the SCREAM process is not necessary, and no further patterning steps for interconnecting the released structure to active devices on the wafer are required, in accordance with this process. On a blank silicon wafer without dielectric films step (2) can also be skipped, reducing the number of process steps for the fabrication of suspended single crystal silicon structures to 3.

The process of the present invention further comprises an extension of the SCREAM process to allow the fabrication of multiple level structures, including but not limited to, the selective removal of parts of levels. This extension of the process enables the fabrication of suspended elements of different heights, and reduces the process-imposed restriction of previous multiple level processes that all suspended levels must have the same layout. The extended process is applied to the fabrication of novel actuators, electron lenses and micromachines, and allows multiple levels of self-aligned, suspended structures with greater design flexibility.

In the basic SCREAM process, as described in U.S. Pat. No. 5,198,390, a thick silicon dioxide film (1.5–4 $\mu$m) is placed on the surface of a substrate by thermal oxidation of the substrate or by CVD deposition. This film is patterned using a resist layer, photolithography, and $CHF_3$-RIE. The silicon substrate is etched in a vertical RIE step, using the silicon dioxide and photoresist films as an etch mask. Typical etch depths range from 10 to 20 $\mu$m. A subsequent thermal oxidation or CVD deposition covers the surface conformally with a thin (200–400 nm) silicon dioxide layer. A vertical RIE then removes this film from the horizontal surfaces, including the floor of trenches etched by the first vertical RIE; any silicon dioxide on the sidewalls of the SCS structure is not etched.

The top of the SCS structure is still covered with the remainder of the first, thicker silicon dioxide etch mask. A high-pressure (80–90 mTorr) isotropic $SF_6$ RIE of silicon then undercuts the masked silicon structure, completing the fabrication of the first level of structures. In a final metallization step aluminium is deposited by sputtering, covering the released structures nearly conformally.

A multiple level structure can be fabricated using an extension of the SCREAM process, with the same four steps being repeated for each level of the structure: vertical Si-RIE, conformal silicon dioxide deposition, anistropic CHF3 RIE of silicon dioxide and quasi-isotropic RIE of silicon using SF6. After carrying out these steps for the first level of released silicon structures, the silicon substrate is again etched in a vertical RIE for a further 10–20 $\mu$m, without the need for an additional lithographic step; instead, the whole upper-level masked silicon structure serves as a 'shadow mask' for this etch. The exposed silicon underneath the masked silicon structure is not etched due to the high degree of anisotropy of the vertical Si-RIE. The resulting lower-level silicon structure is self-aligned to the upper-level structure, but is slightly wider than the original width of the upper level, since the sidewall oxide deposition increased the width of the upper level structure. A thermal oxidation or CVD deposition again covers all surfaces conformally with silicon dioxide.

A vertical $CHF_3$ RIE again is used to remove the oxide from the horizontal surfaces, with the top of the upper level of silicon structure still being covered by the remaining part of the first (thick) mask oxide. An isotropic $SF_6$ RIE undercuts and releases the masked silicon structure to complete the fabrication of the second level of the microelectromechanical (MEM) structures. This sequence is repeated for each additional level.

In accordance with the present invention, fabrication of multilevel devices may be further simplified by using the combined etch process based on the SCREAM process and the etch process of Laermer et al. The combined etch is used to produce the first layer of a structure, and the SCREAM process is utilized for second and subsequent layers. This combination simplifies the fabrication of multilevel structures by omitting several of the silicon dioxide deposition and etchback steps that would be required if only the SCREAM process were to be used. The modified Laermer et al etch could be used for just one layer or for additional layers, but is not preferred for lower level structures due to the increased impact of its limitations; namely, the maximum linewidths which can be released and the decreasing effectiveness of the release etch in deep, narrow trenches.

After the completion of all levels of the suspended microstructure, a timed thermal oxidation step is used to isolate selected suspended SCS structures by consuming all the silicon in thin isolation segments and to increase the protection of the released structures during subsequent processing.

The structures are then covered with a thick photoresist film (typically 20–60 $\mu$m) so a second lithography step may be used to open contact windows on the suspended structures. These windows are designed to be large enough (>20 $\mu$m features) to be easily exposed in the thick resist and do not require critical alignment to the microelectromechanical beams (which typically are 0.6 to 4 $\mu$m wide). Moreover, they do not have to be exposed through the full thickness of the resist but only down to the top of the upper level of the beams making up the isolation structures, when the contacts are to be made on the top surfaces. The resist forms an etch mask for a wet buffered oxide etch which may be used to open up the contact windows. This etch may also used to selectively remove the $SiO_2$ films from parts of the suspended structure in which case The openings in the resist etch mask have to be large enough to enable the underlying structures to be exposed to the wet etch. After stripping the resist, contacts to the suspended silicon structures are formed by the evaporation of aluminum, followed by a sintering step.

The isolation and contact scheme for multiple-level self-aligned structures selectively contacts and isolates levels, individually as well as all of them simultaneously, while maintaining mechanical support of the suspended structures. Furthermore, the scheme provides a way to electrically connect to the suspended levels from the outside via contact pads through a combination of five elements, which provide (I) electrical isolation on all levels, but mechanical support from the substrate, (ii) electrical isolation within the suspended levels, (iii) isolation on one level while connecting the others, (iv) electrical connections between levels, and (v) electrical connection from an arbitrary level to the top of a contact pad. For practical reasons these pads are preferably at the wafer surface for all levels.

The multiple-level contact and isolation scheme of the invention makes use of the feature of the present process that the lower levels are wider than the upper levels, as described above, which widening is caused by the broadening of the structures in the sidewall oxide deposition step. As noted above, the upper level is etched by a vertical Si-RIE, which is followed by a thermal oxidation of the sidewalls. This oxidation step increases the width of the structures even though some of the silicon is consumed; the volume of the resulting silicon dioxide is 2.2 times larger, which leads to a net widening of the structures by an amount roughly equal to the film thickness. Alternatively, the sidewall film may be deposited by CVD, in which case the widening is twice the deposited film thickness. This widened structure now forms the mask for the vertical silicon RIE which defines the lower level structure. This lower level structure is thus wider than the upper level by about the sidewall film thickness. Both levels are again thermally oxidized and then the lower level is released as well. This may be followed by a long oxidation step, designed to consume all the silicon in the thinnest segments of the released beams to produce silicon dioxide isolating segments in the beams.

The strength of this isolation scheme is the simplicity of the process sequence, for only one lithography step and one metal deposition is required, independent of the number of levels. Thermal silicon dioxide bridges provide high quality insulation between suspended levels and the substrate with low leakage currents and high breakdown voltages.

The present invention, in another aspect, comprises new types of actuators using multiple levels of electrodes which preferably are fabricated using the improved process of the invention. These actuators show an increased range of motion compared to conventional single-level electrostatic comb actuators and generate higher forces. They include designs which operate bi-directionally and allow multistable configurations. As these new actuator designs generate a higher force per substrate area used, they are of particular interest for the integration of dense arrays of actuators. In order to effectively use the advantages of the multiple-level designs, the gaps between the electrodes need to be kept small, and the electrodes accurately aligned.

In still another aspect, the present invention comprises a new type of clamping device, which allows the accurate positioning and clamping of micro- to mini-scale elements, such as optical fibers, by exploiting the self-aligned nature of the multiple levels.

BRIEF DESCRIPTION OF THE DRAWINGS

The foregoing, and additional objects, features and advantages of the present invention will become more clearly understood from the following detailed description of preferred embodiments thereof, taken with the accompanying drawings, in which:

FIG. 6b is a photomicrograph of the two-level MEM structure illustrated in FIG. 6a;

FIG. 7b is a photomicrograph of the two-level structure illustrated in FIG. 7a;

FIGS. 14a and 14b illustrate another multiple-level extension of the process of the invention, including focused ion beam modification of suspended structures illustrating the elimination of an upper level;

FIGS. 15a and 15b illustrate focused ion beam modification of lower level element(s);

DESCRIPTION OF PREFERRED EMBODIMENTS

Figure 1A:
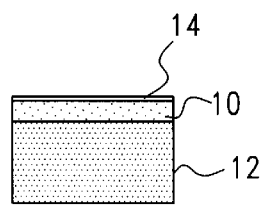
FIGS. 1a to 1h diagrammatically illustrate the prior art SCREAM process.
Figure 1B:
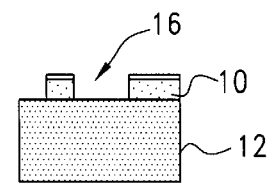
Figure 1C:
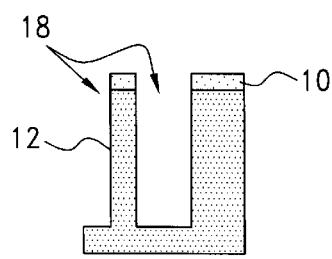
Figure 1D:
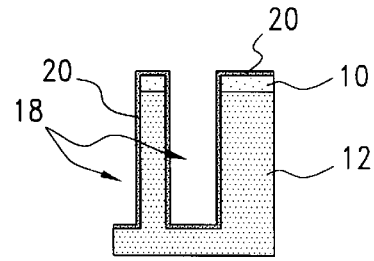
Figure 1E:
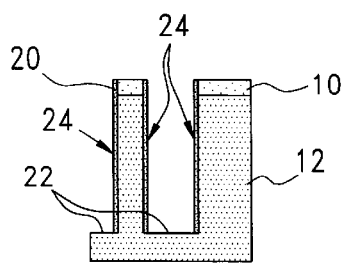
Figure 1F:
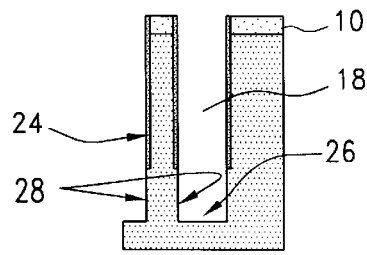
Figure 1G:
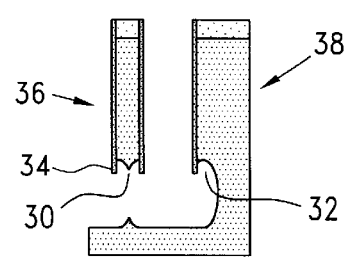
Figure 1H:
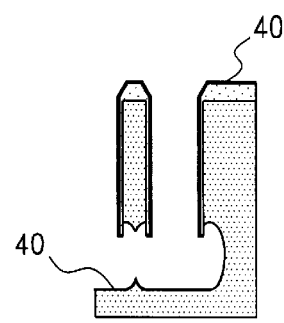

Turning now to a more detailed description of the processes used in the present invention, FIGS. 1a–1h illustrate in diagrammatic form the prior art Single Crystal Reactive Etch and Metallization (SCREAM) process for fabrication of microelectromechanical MEM) structures and devices, as described in greater detail in U.S. Pat. No. 5,198,390. Broadly, this process includes the steps of silicon mask deposition (FIG. 1a); patterning of the mask layer by photolithography and reactive ion etching (RIE)(FIG. 1b); deep vertical silicon etching by Si-RIE (FIG. 1c); conformal deposition of silicon dioxide (FIG. 1d); anisotropic etchback of the silicon dioxide (FIG. 1e); an optional second vertical Si-RIE which is an extension etch (FIG. 1f); an isotropic RIE of silicon, as a release etch (FIG. 1g); and an aluminum sputter deposition (FIG. 1h).

In greater detail, the SCREAM process begins with the deposition of a silicon dioxide layer 10, typically 1–3 μm thick on a wafer or substrate 12. Next, photolithography on a resist layer 14 is used to define the layout of the MEM structure and the pattern is transferred by RIE to the silicon dioxide layer to form a mask 16. Usually this is done by magnetron ion etching (MIE) which achieves higher etch rates, for example 250–300 nm/min, than conventional parallel-plate RIE (<30 nm/min). The patterned silicon dioxide layer 10 and resist layer 14 serves as the etch mask 16 for a subsequent vertical RIE of the silicon substrate, which forms trenches 18 typically to a depth between 10 and 30 μm, as illustrated in FIG. 1c. After stripping the resist 14, the wafer is coated conformally with 100–300 nm of silicon dioxide 20 in a CVD deposition step. The silicon dioxide 20 is then etched back on horizontal surfaces in an anisotropic RIE, exposing the silicon substrate on the floors 22 of the trenches 18. The sidewalls 24 of the etched silicon structures are still covered by the oxide film 20, while the tops of the structures are covered by the remainder of the (thicker) mask oxide 10 deposited in the first process step.

An optional second vertical RIE of the silicon substrate is used to extend the etched trenches 18 further into the substrate, as indicated at 26 in FIG. 1f, typically by between 5 to 10 μm. At this point in the process, the upper parts of the trench sidewalls 24 are covered by a silicon dioxide film, while on the lower parts 28 of the sidewalls the silicon is exposed. An isotropic RIE of silicon using $SF_6$ gas and high pressure (80–100 mTorr) is then used to undercut the SCREAM structures in regions 28 to remove the exposed silicon in the lower part, but silicon will not be removed in the upper part since it is protected by the silicon dioxide mask 20. There is some etching up into the silicon structure underneath the oxide mask 20, as at 30 and 32, generating an overhanging silicon dioxide film or 'skirt' 34 at the bottoms of the resulting dioxide-covered SCS structures 36 and 38.

In the final process step, a metal layer 40, such as aluminum (about 300 nm) is deposited by sputtering, as illustrated in FIG. 1h. The metal coverage is nearly conformal; the horizontal and vertical surfaces are all coated with aluminum, but the undercut regions 30 and 32, under the silicon dioxide 'skirt' are not covered. Thus, the deposited aluminum film does not contact the exposed part of the silicon core of the silicon structures, or beams, from underneath, and is elsewhere isolated from the core by the silicon dioxide layer.

Figure 2:
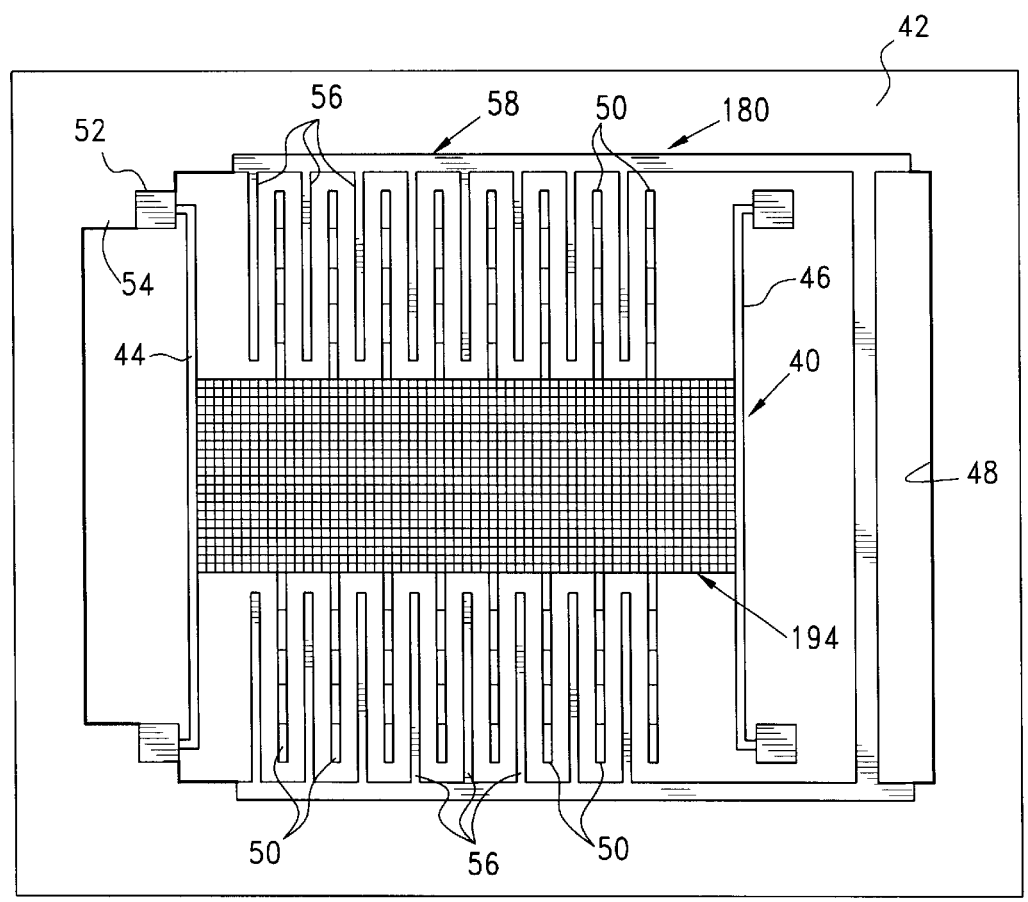
FIG. 2 is a diagrammatic illustration of a single-level MEM structure fabricated by the process of FIGS. 1a–1h.

FIG. 2 is a diagrammatic illustration of a simple MEMS device 40 fabricated on a substrate 42 using the SCREAM process. The entire structure is covered with aluminum, including the spring supports 44 and 46 which suspend the structure in a trench 48 in the substrate. The Al film on the spring provides the electrical connection of comb capacitor electrodes 50 to contact pads 52 on top of anchors 54. The isolation of the Al-film is maintained as well for the fixed structures and anchors from which the beams are suspended as long as they are surrounded by a trench. The anchor is undercut by the isotropic release etch, but not completely like the suspended beams, so it is still connected to the substrate. It does however have the same oxide skirt which isolates the Al-film on the top and sides of the structure from the silicon underneath.

A wide variety of SCREAM MEMS have been fabricated, including accelerometers, friction and microloading machines, and tunable resonators. Typical SCREAM beam dimensions are a silicon height of 10–30 μm and a silicon width of 1 to 2 μm to produce a high aspect ratio beam, a remaining top oxide film thickness of about 0.5 to 1 μm, 200–400 nm thickness of sidewall oxide and 300 nm thickness of Al. The high aspect ratio of the beams makes them very stiff with regard to out of plane motion and allows them to span lengths of up to several millimeters.

The SCREAM process described above requires only a single lithography step and uses a dry release step which eliminates stiction problems commonly observed during the wet release etch in surface micromachining. It uses only low-temperature (<300° C.) steps and can thus be performed on wafers with prefabricated electronic circuits. However, the simplicity of the SCREAM process also imposes some limitations on the resulting devices, which are overcome by the process of the present invention.

The Laermer et al process, as modified in accordance with the present invention to yield a combined vertical Si RIE and release etch, is illustrated in FIGS. 3a to 3e, to which reference is now made. Following conventional lithography to produce a mask 60 on a silicon substrate 62, a short, nearly isotropic plasma RIE silicon etch, indicated by arrow 64 in FIG. 3a, etches the exposed surface 66 of the silicon to form a shallow trench 68. The etch undercuts the mask 60 slightly, as illustrated at 70.

Figure 3A:
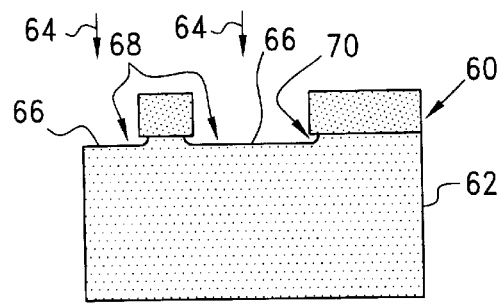
FIGS. 3a–3e diagrammatically illustrate a first embodiment of the present invention.
Figure 3B:
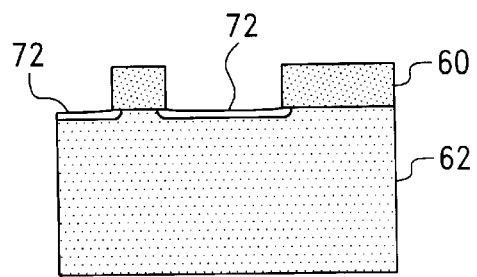

Following the first etch step, a first passivation layer 72 is applied conformally to all exposed surfaces, including the exposed silicon surface 66 and the sidewall silicon surface at undercut region 70 below the mask 60, as illustrated in FIG. 3b. This layer 72 is preferably a polymer film, and forms an effective etching stop layer on the side walls.

Figure 3C:
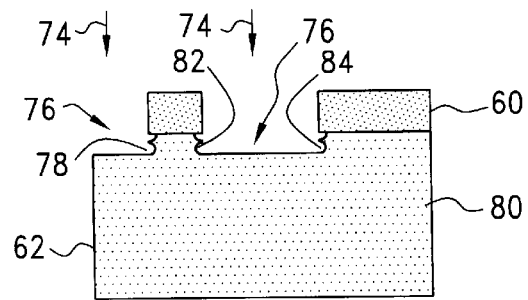
Figure 3D:
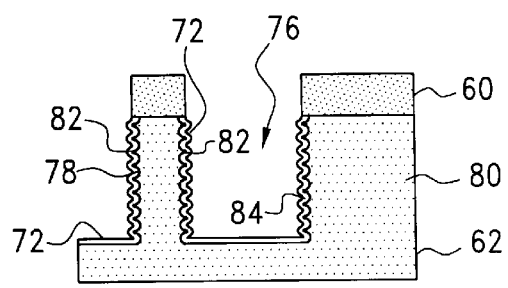
Figure 3E:
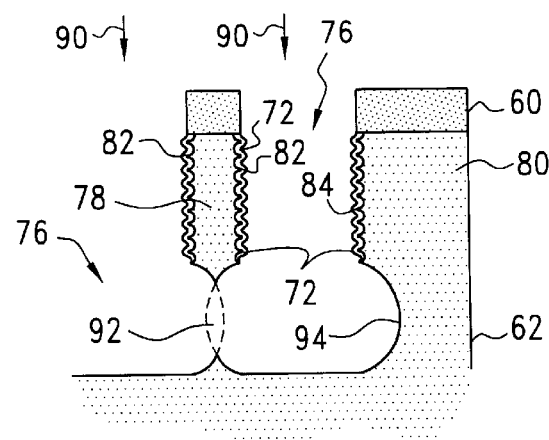

A second, nearly isotropic Si-RIE etching step, illustrated in FIG. 3c at arrow 74, breaks through the polymer layer 72 on the horizontal surfaces of the trenches 68 by ion bombardment (sputter etching) and deepens the trenches as indicated at 76 by etching the exposed silicon. During this second step, the side walls of the structures 78 and 80 being etched remain protected by the polymer layer. The second etch produces additional undercuts 82 and 84 beneath the protective polymer layer applied in the previous step. A second passivation layer is next applied to the exposed silicon sidewall and floor surfaces, and the process is repeated, as illustrated in FIG. 3d, to produce a desired trench depth and resulting structure height and width. The sidewall profile of the etched silicon structures is determined by the balance between etching and passivation steps.

In accordance with the present invention, an additional step is utilized in combination with the foregoing process to effect release of etched structures without the additional sidewall passivation layers required in the SCREAM or similar processes. A long passivation step is used to deposit a thicker polymer film as indicated for structure 78 in FIG. 3e. In order to release the structure, a long quasi-isotropic Si RIE, indicated by arrows 90, is used. This etch removes the polymer from the horizontal surfaces by sputter etching and deepens trench 76, and also etches the sidewalls 82 on structure 78 and the sidewall 82 on structure 78 and the sidewall 84 on structure 80 to undercut these structures at 92 and 94, respectively. The width of structure 78 is selected, during the masking process, to be such that the undercut 92 extends through structure 78 to release it, whereas structure 80 is undercut, but not released.

The width of structures which can be released is limited by the ability of the sidewall passivation to protect the structure created in the preceding vertical etch. This requires careful selection of the release etch rate and isotropy, and of the amount of passivation required to sustain the release. The release timing is determined by three parameters: the lateral etch rate of silicon, and the lateral etch rate and the vertical etch rate of the passivation film during the release step. The lateral silicon etch rate determines the etch time required to release the structures, the vertical etch rate of the passivation film determines the time required to etch the passivation on the floor, and the lateral etch rate of the passivation determines the maximum etch time before the released silicon structures themselves are damaged during the release etch.

In tests, it was found that for the parameters used, the passivation film on horizontal surfaces is etched approximately five times faster than it is deposited, reducing the effective etch time by 20% of the deposition step duration. The lateral silicon etch or release rate was found to be approximately 1.6 micron/min. There was a slight deviation from the linear relationship at higher etch and deposition times, which was attributed to reduced deposition rate with increased film thickness. In order to guarantee sufficient sidewall protection it was found that the ratio of etch to deposition time should be kept at or below 1.2. For use in a multiple level process, the etch time should be minimized to minimize the vertical gap between the released structures and the substrate floor. This is important to obtain efficient shadowing during subsequent anisotropic silicon and oxide etches. Furthermore, the combined etch is more difficult to use for lower level structures due to the reduced etch rates, especially in deep, narrow trenches.

In accordance with this invention, multiple level MEM devices can be fabricated using either the SCREAM process or the Laermer et al process for the first level, and then using the SCREAM process for subsequent formation of lower levels. The SCREAM/SCREAM process is diagrammatically illustrated for two-level structures in FIGS. 4a–4j, to which reference is now made. It will be understood that these Figures show only a small portion of a MEMS device in cross-section to demonstrate the process steps. Broadly, the process includes depositing a silicon dioxide film on a substrate and patterning the film using conventional resist and lithography steps and an anisotropic RIE to form a mask (FIG. 4a) which defines the structure to be fabricated; performing an upper level vertical Si-RIE (FIG. 4b); conformally thermally oxidizing the sample followed by an anisotropic oxide etchback (FIG. 4c); performing an isotropic undercut RIE (FIG. 4d); performing a lower level vertical Si-RIE (FIG. 4e); conformally thermally oxidizing the sample, followed by an anisotropic oxide etchback (FIG. 4f); performing a lower level release RIE (FIG. 4g), followed by a long thermal oxidation (FIG. 4h); a thick resist lithography and wet oxide etch (FIG. 4i); and metallization (FIG. 4j).

Figures 4A, 4B, 4C, 4D:
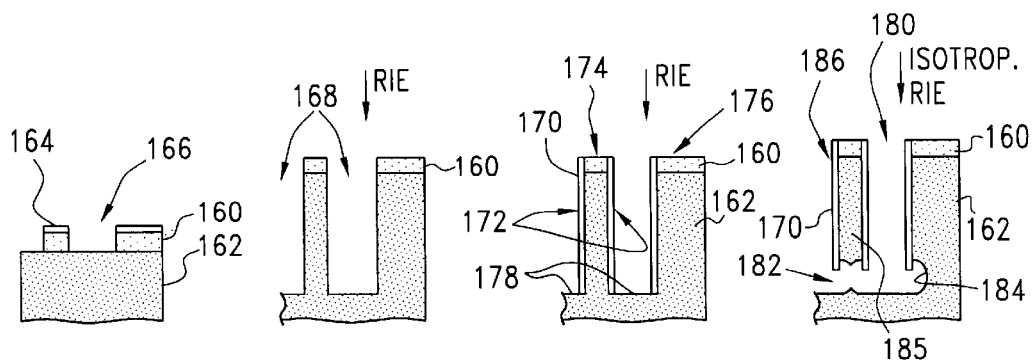
FIGS. 4a–4j diagrammatically illustrate a second embodiment, which is a multiple-level extension of the process of FIGS. 1a to 1h, providing oxidation and removal of upper level(s)

As illustrated in FIG. 4a, a thick silicon dioxide film 160, which may be 1.5–4 μm thick, is formed on the top surface of a single crystal silicon substrate 162 by thermal oxidation, or the film is deposited by chemical vapor deposition (CVD). This film is patterned using a resist layer 164, photolithography, and $CHF_3$ RIE to form a pattern mask 166.

The sequence of the following four process steps is repeated for both levels of the illustrated two-level MEM structures. First, the silicon substrate 162 is etched in a first vertical RIE step (FIG. 4b), using the silicon dioxide and photoresist films 160 and 164 as an etch mask, to form trenches 168. Typical etch depths range from 10 to 20 μm. Second, a subsequent thermal oxidation or CVD deposition covers the substrate surface conformally with a thin (200–400 nm) silicon dioxide layer 170 (FIG. 4c). Third, a second vertical RIE removes this film from the horizontal surfaces. The silicon dioxide 170 on the sidewalls 172 of the SCS structures exemplified by beam and wall structures 174 and 176, respectively, is not etched, but is removed from the floor 178 of the trenches to expose the underlying substrate 162. The tops of the SCS structures are still covered with the remainder of the first, thicker silicon dioxide etch mask 160. Fourth, a high-pressure (80–90 mTorr), nearly isotropic $SF_6$ RIE of silicon, indicated by arrows 180, then undercuts the masked silicon structures at 182 and 184 (FIG. 4d), releasing beam 185 and completing the fabrication of the first level of structures, as generally indicated at 186. So far, the process follows the sequence of the SCREAM process of FIGS. 1a–g.

Figures 4E, 4F, 4G, 4H:
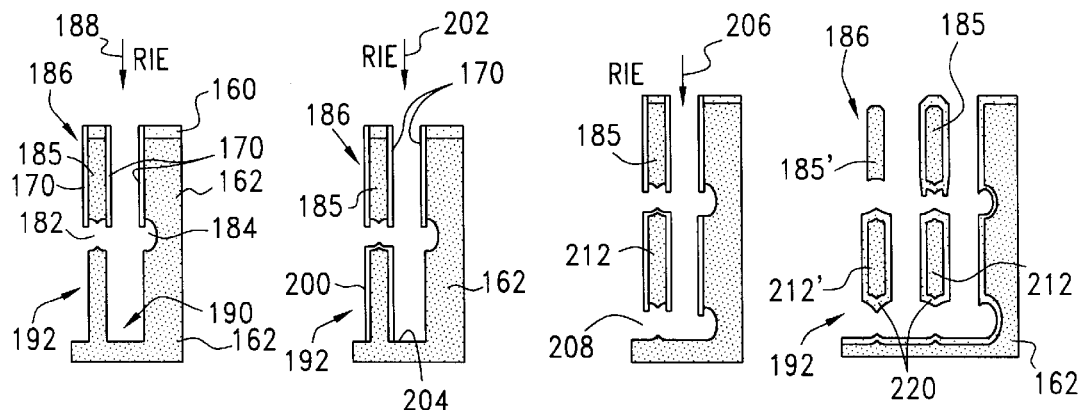
Figures 4I, 4J:
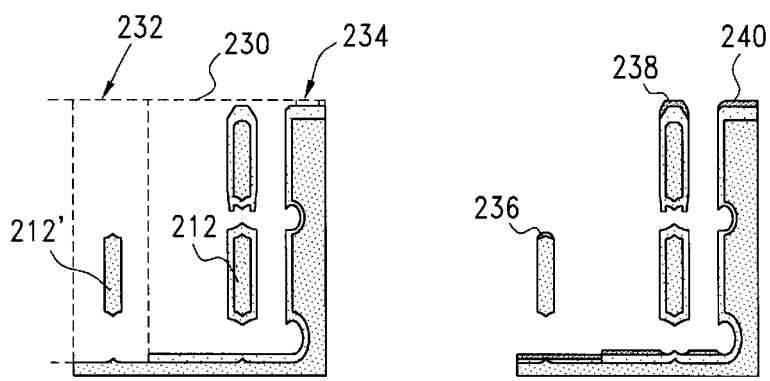

The same four steps illustrated in FIGS. 4b–4d are repeated for the second level, as illustrated in FIGS. 4e–4g. Thus, the silicon substrate is etched in a third vertical Si-RIE, indicated by arrow 188, for a further 10–20 μm (FIG. 4e), as illustrated at trench extension 190. The whole upper-level masked silicon structure 186 serves as a 'shadow mask' for this etch so that the silicon underneath the masked silicon structure 186 is not etched due to the high degree of anisotropy of the Si-RIE 188. The resulting lower-level silicon structure 192 is self-aligned to the upper-level structure 186, but is slightly wider than the original width of the upper level, since the sidewall oxide deposition 170 has increased the width of the upper level structure.

The next step is another thermal oxidation or CVD deposition 200 (FIG. 4f), which again covers all surfaces conformally with silicon dioxide. Next, a vertical $CHF_3$-RIE indicated by arrow 202 removes the oxide from the horizontal surfaces to expose the floors 204 of the trenches, but leaving the tops of the upper level silicon structures still covered by the remaining part of the first (thick) mask oxide 160. A nearly isotropic $SF_6$ RIE, illustrated by arrow 206, is used to undercut the lower masked silicon structures 192 (FIG. 4g) at 208 and 210, and to release the narrow beam 212. This completes the fabrication of the second level 192 of the MEM structures. If more than two levels are to be fabricated, this sequence (FIGS. 4 e–g) is repeated for each additional level.

After the completion of all levels of suspended microstructures, a timed thermal oxidation step is used to electrically isolate the suspended SCS structures by consuming all the silicon in thin isolation segments which are designed as part of the MEM structure, converting the silicon to electrically insulating silicon dioxide. This is illustrated in FIG. 4h, which, for convenience, illustrates additional released beams 185' and 212', fabricated in the manner described above for beams 185 and 212, but designed to be thinner (narrower) in cross-section. The thermal oxidation produces a layer of silicon dioxide 220 on all exposed silicon and increases the thickness of the oxide where it had previously been deposited. As illustrated, the beam 185' is designed to have at least a portion which is sufficiently thin that all of the silicon is consumed, leaving the thin portion of the beam formed completely of silicon dioxide, and thus electrically insulating.

Figure 5:
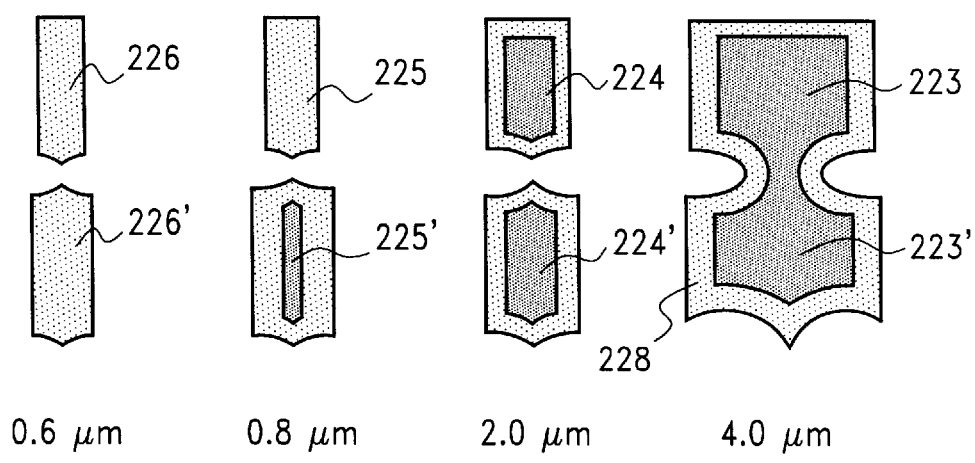
FIG. 5 is a diagrammatic enlarged cross-sectional view of a two-level MEM structure fabricated in accordance with the process of FIGS. 4a–4h.

FIG. 5 illustrates an enlarged cross-sectional view of a MEM structure fabricated in accordance with the two-level process of FIGS. 4a–4h. The structure 222 includes upper and lower beams 223, 223'; 224, 224'; 225, 225' and 226, 226' which were fabricated in the silicon substrate to have different nominal (CAD) widths of 4.0 μm; 2.0 μm; 0.8 μm and 0.6 μm, respectively. As described above, the upper level beams 223, 224, 225 and 226 were etched using a vertical silicon RIE, followed by a thermal oxidation step or by a CVD oxide deposition step. The resulting upper beams, widened by the oxidation step, form a mask for the vertical silicon RIE which defines the lower level beams 223', 224', 225' and 226'. Both levels are again oxidized, as indicated by oxide layer 228 and the lower level is released. A long oxidation step consumes the silicon in the thinnest beams.

In one example of the process, the initial oxidation of the upper level beams may increase the width of the upper beam by 200 nm, and this produces a lower level beam 200 nm wider than the corresponding upper level beam. Thus, a 0.6 μm-wide beam 226 on the upper level shadows a 0.8 μm-wide beam 226', a 0.8 μm-wide beam 225 shadows a 1.0 μm-wide beam 225', and so on. In this example, the final thermal oxide step may be selected to consume a total of 0.8 μm of silicon beam width, producing the structure illustrated in FIG. 5. The oxide extending through the complete width of beams 225, 226 and 226' produces an electrically insulating barrier in that beam segment, while retaining the mechanical integrity of the beam.

To enable the MEM device to be electrically connected to external circuitry, or to circuitry fabricated on the same wafer, the microstructures are covered with a thick photoresist film 230, typically 20–60 μm thick, as illustrated in phantom in FIG. 4i, and a second lithography step is used to open contact windows such as window 232 on the suspended structure and window 236 on the wall portion. These windows are designed to be large enough (>20 μm features) to be easily exposed in the thick resist and to not require critical alignment to the MEM beams 185, 185', 212, and 212' (which may be 0.6 to 4 μm wide), as well as the wall portion formed by the surrounding substrate 62. Moreover, the windows do not have to be exposed through the full thickness of the resist but only down to the tops of the upper level beams 185 and 185', and the top of the wall portion when contact is to be made to these features. The resist 230 forms an etch mask for a wet buffered oxide etch which will open up the contact windows to expose the underlying silicon.

As illustrated at window 232 in FIG. 4i, the oxide etch can also be used to selectively remove the SiO₂ films from selected structures, such as the beam 212', and to remove a completely oxidized structure such as beam 185'. In this case, the openings in the resist should be large enough that they are exposed all the way to the bottom of the suspended structures.

After stripping the resist 230, metal contacts 236, 238, and 240 are applied to the suspended silicon structures 212', 185, and wall portion 162, respectively, by the evaporation of aluminum, followed by a sintering step (FIG. 4j).

Another embodiment of the invention utilizes the combined etch based on SCREAM and the Laermer et al process for the first level of a multilevel MEM structure, as described with respect to FIGS. 3a–3e. These steps replace the steps illustrated in FIGS. 4a to 4d, described above, with the resulting structure of FIG. 3e serving as a shadow mask to fabricate the next lower level, following the process steps of FIGS. 4e–4g. In this multiple-level process, a sidewall silicon dioxide is still required to achieve the broadening of the suspended structures on lower levels that is essential to the isolation and contact scheme. Additional layers may be fabricated using the combined etch, but due to its limitations discussed above they are commonly fabricated by repeating the steps of FIGS. 4e–4g.

After completion of all of the desired levels of suspended structures, the timed thermal oxidation of FIG. 4h is used to electrically isolate the suspended silicon structures by consuming all the silicon in selected thin isolation segments on all levels. Thereafter, the structures are covered with a thick photoresist film (typically 20–60 mm) and a second lithography step is used to open contact windows on the suspended structures as described with respect to FIG. 4h. These windows are designed to be large enough (>20 mm features) to be easily exposed in the thick resist and to not require critical alignment to the MEM beams (which are 0.6 to 4 mm wide). Moreover, they do not have to be exposed through the full thickness of the resist but only down to the top of the upper level beams. The resist forms an etch mask for a wet buffered oxide etch to open up the contact windows. This etch may also be used to selectively remove the SiO₂ films from part of the suspended structures (FIG. 4i). In this case the openings in the resist have to be large enough such that they are exposed all the way to the bottom of the suspended structures. After stripping the resist contacts, the suspended silicon structures are formed by the evaporation of aluminum, followed by a sintering step (FIG. 4j).

Figure 6A:
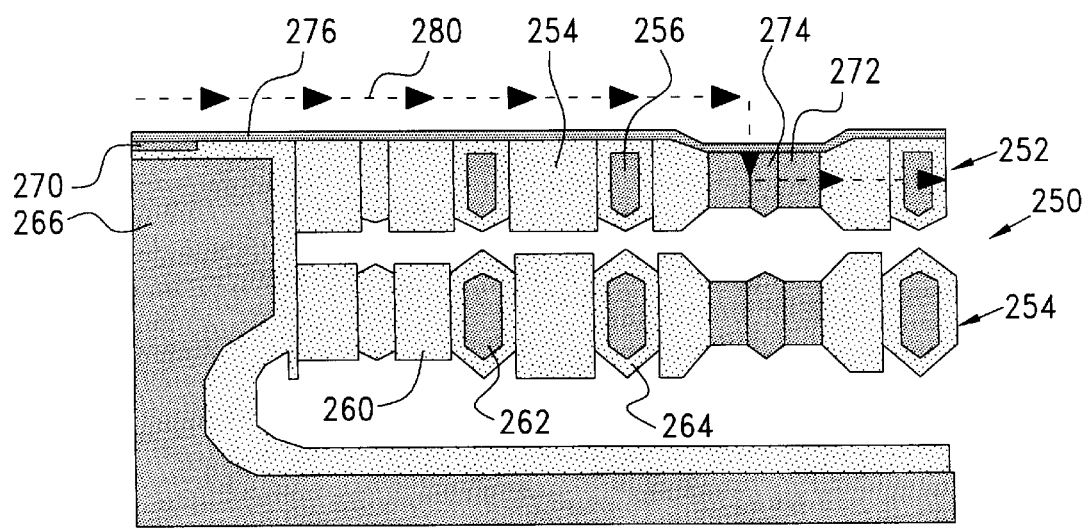
FIG. 6a is a diagrammatic cross-sectional view of a two-level MEM structure fabricated in accordance with the process of the invention to electrically isolate both suspended levels from the substrate and to provide an electrical contact to the upper level.
Figure 6B:
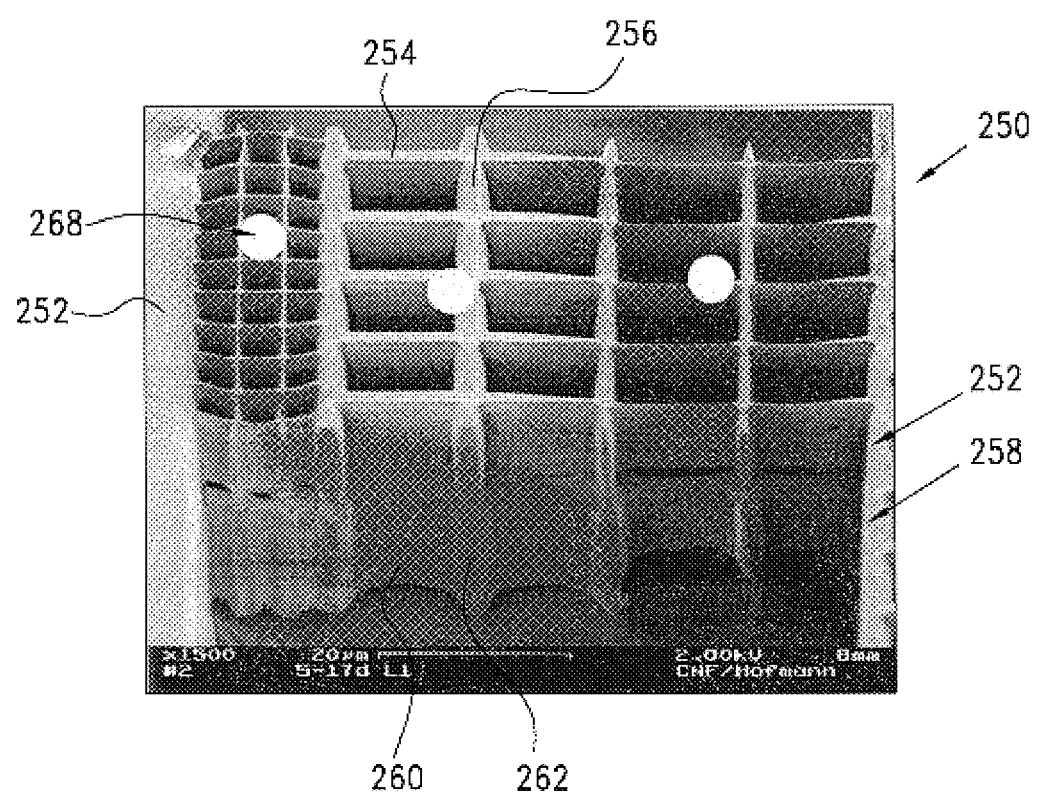

A successful isolation and contact scheme for multiple-level self-aligned structures such as those fabricated by the foregoing processes has to be able to selectively contact and isolate structures individually as well as all of them simultaneously, while maintaining mechanical support of the suspended structures. Furthermore, such a scheme has to provide a way to electrically connect to the suspended levels from the outside via contact pads at the wafer surface for all levels. An example of a combination of beams and beam segments used to electrically interconnect the various parts of a two-level structure are illustrated in FIGS. 6a and 6b. Thus, a two-level structure 250 comprises an upper level 252 made up of interconnected longitudinal beams 254 and cross beams 256, and a lower level 258 made up of interconnected longitudinal beams 260 and cross beams 262. The upper and lower beams are vertically aligned by the fabrication process described above, with the beams 260 and 262 on the lower level being wider than the corresponding beams 254 and 256 in the upper level. In this illustrated embodiment, the silicon core of the upper beams may be 2 mm wide. The beams are electrically conductive, but are coated with an oxide layer 264 in the manner discussed above, so as to be electrically isolated. The upper and lower levels are mechanically isolated from each other, but are mechanically supported on the substrate 266 by way of fully oxidized, narrow support beams 268, which may be 0.6 mm thick, for example.

To provide an electrical connection between the structure 250 and a contact 270 on the substrate 266, the silicon dioxide layer 264 is selectively removed from part of a beam, such as at longitudinal beam segment 272 and cross beam segment 274 (FIG. 6a) on the upper level 252. Thereafter, an aluminum film 276 may be evaporated on the top of the upper level beams or beam segments which have been exposed by selective removal of the oxide. This Al film also forms the top layer on the contact pad 270, which is used to connect the beams to external circuitry. The dotted line 280 illustrates the current path from the contact pad to the suspended beams.

Figure 7A:
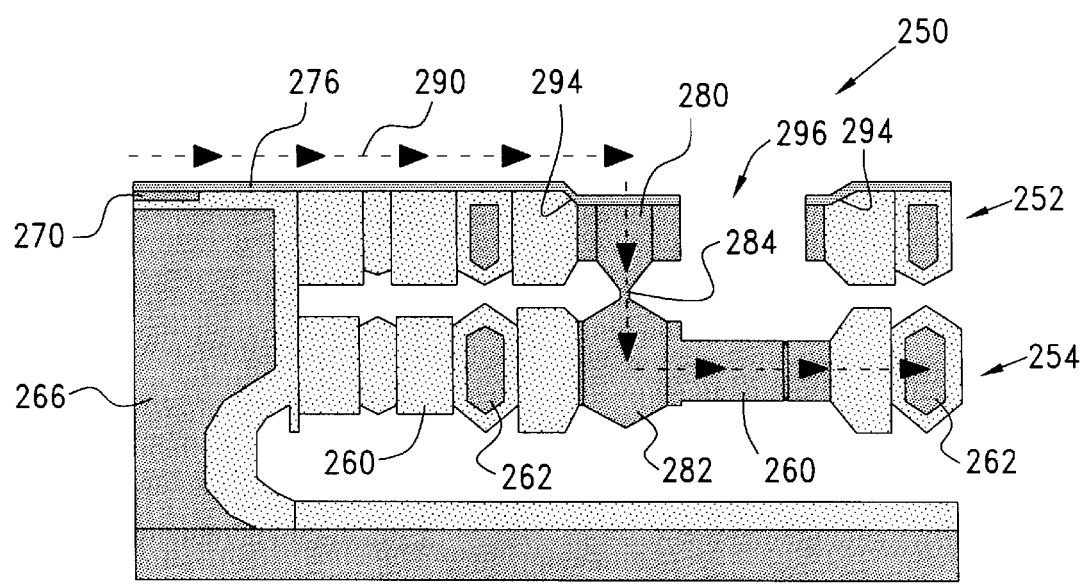
FIG. 7a is a diagrammatic enlarged cross-sectional view of a modification of the two-level MEM structure of FIG. 6a which is used to electrically isolate both suspended levels from the substrate and to provide an electrical contact to the lower level, and which includes the selective removal of part of the upper level structure.

An example of a structure for connecting the lower level 254 of the two-level structure 250 to contact pad 270 on substrate 266 is illustrated in FIG. 7, wherein the beams are fabricated as described with respect to FIG. 6. The structural beams 254 and 256 are generally 2 mm wide, to provide the isolation between levels as described. However, in this case selected beam segments, such as cross beam segments 280, 282 are designed to be wider than the rest of the beams, for example 4 mm wide for the upper beam segment 280, so that during the release step in the fabrication process, the beam segment 280 is not completely undercut, and thus is not released from the underlying segment 282. This creates a bridge 284 between the upper and lower levels, to allow current flow through the Al layer 276, beam segment 280, bridge 284 and beam segment 282 to the lower level beams 260 and 262, as indicated by current path 290.

In order to avoid short circuiting the upper and lower levels, the segments 280 are isolated by 0.8 µm wide segments 292, which are fully oxidized on the upper level 252 but are thick enough to maintain electrical contact on the lower level. The Al layer 276 on top of the contact pad 270 is connected to the part of the upper level which is connected to the lower level by opening up a contact window 294 in the silicon dioxide covering the beam segment 280.

Figure 7B:
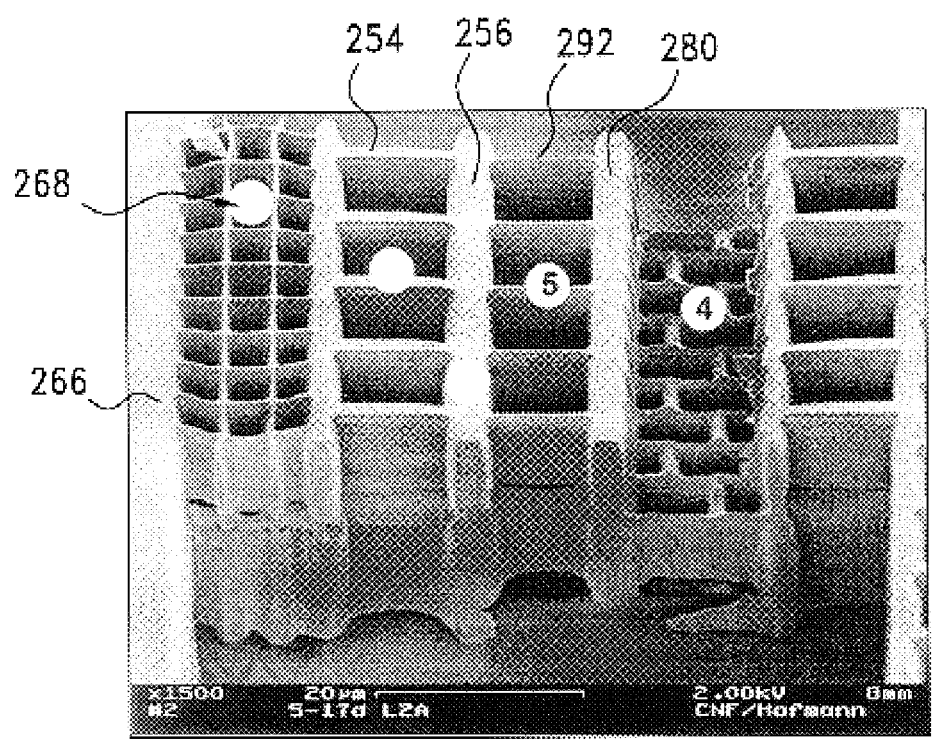

FIG. 7b is an electron micrograph of an actual structure, and shows how the window 294 for the wet silicon dioxide etch is wide enough to include 0.8 mm wide isolation segments in region 296. This is crucial to obtain isolation between the suspended levels without a further lithography step, for if the $SiO_2$ beam segments were not removed, the Al film on top of the upper level structure would run from the lower level contact pad across the suspended structure to the upper level contact pad. This short-circuit between the levels can be removed by an additional lithography step followed by an Al etch, but is eliminated more conveniently by simply removing the $SiO_2$ segments 296 on the upper level when the contact windows are etched before Al deposition. Using this solution the lower level contact structure does not provide mechanical support for the upper level, while the upper level contact structure provides mechanical support for both levels.

This isolation and contact concept can be extended to more than two levels: for three levels it requires 6 different beam segment features for (I) providing electrical isolation and mechanical support from the substrate for all three levels and isolation of suspended elements on all levels; (ii) isolation on the top and middle levels, but connection on the bottom level; (iii) isolation on the top level, but connection on the middle and bottom levels; (iv) separate levels without mechanical or electrical contact; (v) electrical connections between the top and middle levels; and (vi) electrical connections between all three levels.

Figure 8:
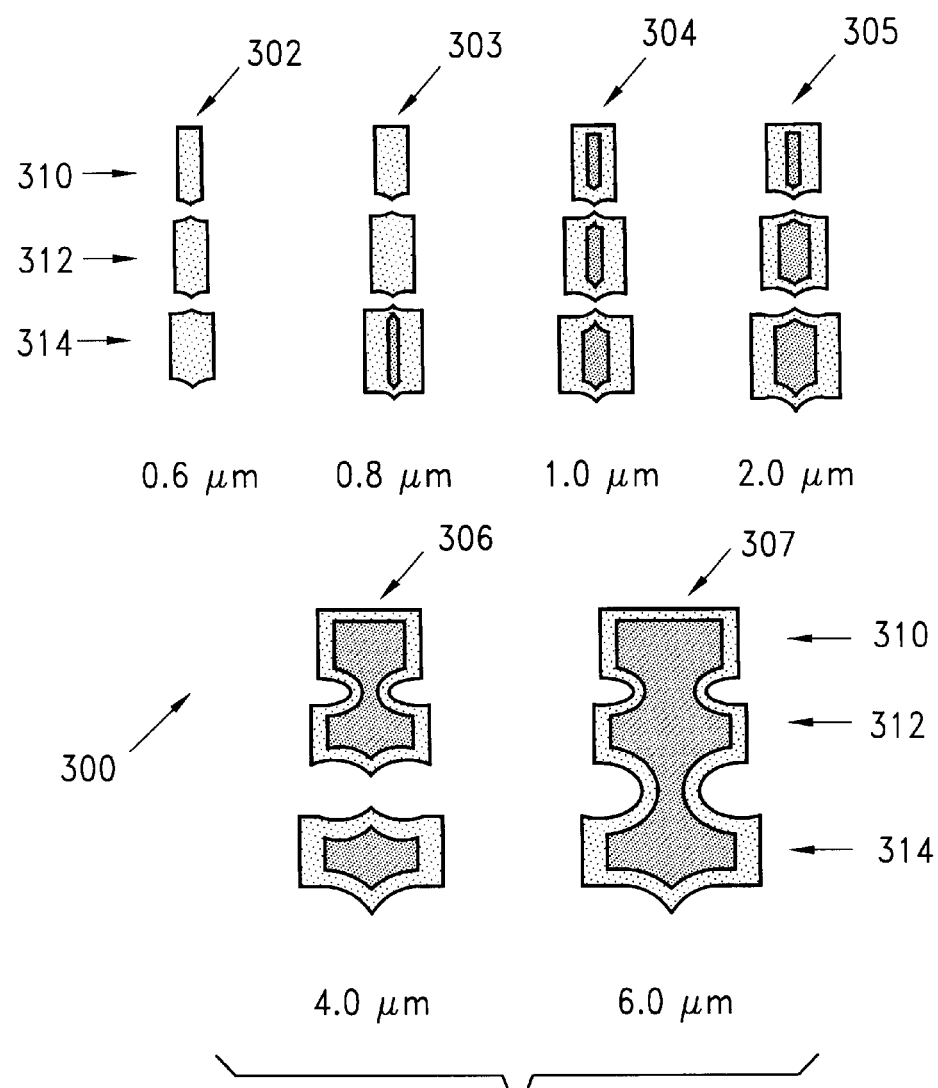
FIG. 8 is a diagrammatic illustration of isolation schemes for the MEM structures of the invention, in this case for 3 suspended levels.

FIG. 8 shows diagrams of these six different elements used in the three-level isolation scheme generally indicated at 300. The nominal CAD beam widths vary from 0.6 µm to 6 µm, as illustrated by beams 302–307. The fabrication sequence is similar to those described above; after the vertical Si RIE of the top level 310, a thermal oxidation step widens the underlying structures in level 312 by 0.2 µm. The wider middle level 312 is etched by vertical RIE and widened again in the sidewall thermal oxidation by another 0.2 µm. Thus the bottom level 314 structures are 0.4 µm wider than the line width of corresponding top-level structures. The final long oxidation release step is timed to lead to the complete oxidation of 1 µm wide beam segments. Thus, the nominal 0.6 µm wide beams 302, which are 0.6 µm, 0.8 µm and 1.0 µm wide on the top, middle and bottom levels respectively, are fully oxidized on all levels to provide the electrical isolation of feature (I). The nominal 0.8 µm beams 303 are fully oxidized on the top (0.8 µm wide) and middle levels (1.0 µm wide) but maintain electrical contact on the bottom level (1.2 µm wide) to provide feature (ii). The nominal 1.0 µm wide segments 304 are only fully oxidized on the top level but electrically conducting on both the middle (1.2 µm wide) and bottom (1.4 µm wide) levels to provide feature(iii). The nominal 2.0 µm and wider levels are conducting on all levels but their inter-level connections differ: the 2.0 µm beams 305 are electrically isolated from each other to provide feature (iv), the 4.0 µm wide segments 306 provide an electrical connection between the top and middle levels while maintaining isolation from the bottom level for feature (v), and the 6.0 µm wide pieces 307 electrically connect all three levels for feature(vi).

Figure 9A:
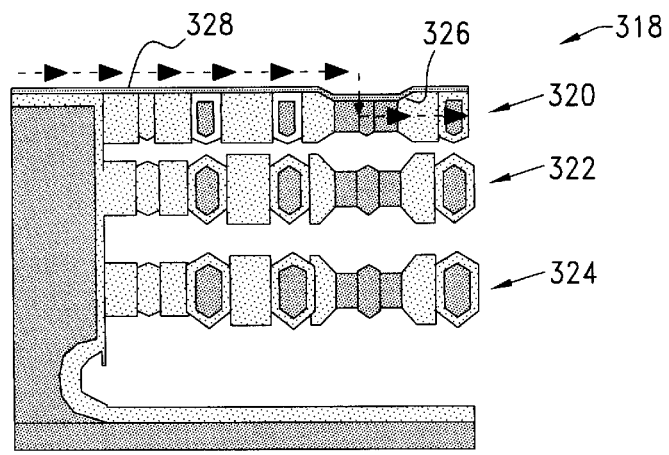
FIGS. 9a–9c are diagrammatic illustrations, in cross-section, of current paths for 3-level MEM structures.

The contact structures to connect three individual levels 320, 322 and 324 to the top of a contact pad are illustrated in FIG. 9. FIG. 9a shows a top level contact structure 318 which is equivalent to the structure of the two level case of FIG. 6a, wherein 2 µm wide structural beams provide isolation between all levels and are isolated on all levels from the substrate by nominal (CAD) 0.6 µm wide beam segments which provide the mechanical support, as described above. Contact windows 326 on the top-level structure beams 320 make electrical contact to the Al film 328 covering the contact pads and the top-level structures 320.

Figure 9B:
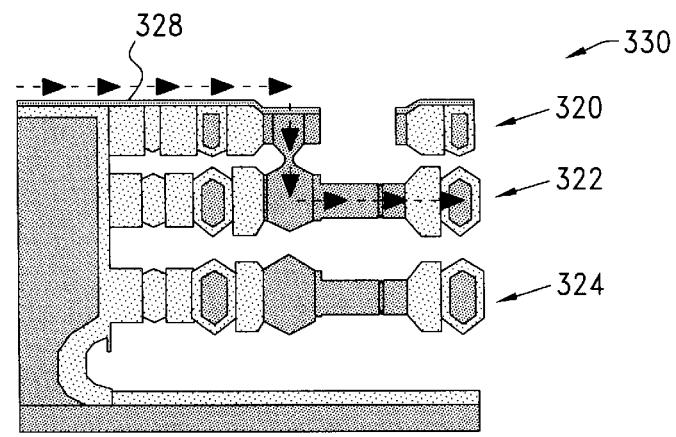

FIG. 9b illustrates a structure 330 to electrically connect a contact pad to the middle level 322, which is similar to the lower level contact structure of the two-level process shown in FIG. 7. All levels are isolated from the substrate by 0.6 µm wide beams, and 4.0 µm wide segments contact part of the top level 320 to the middle level 322, but not to the bottom Level 324. The part of the top level 320 which is connected to the middle level by the 4.0 µm segments is isolated from the rest of the top level by 1.0 µm wide beams. The 1.0 µm segments insulate the top level 320 while providing electrical connections to the middle level. The bottom level is mechanically connected to the substrate by the insulating 1.0 µm beams (the widened third level of the nominal 0.6 µm beams)

Figure 9C:
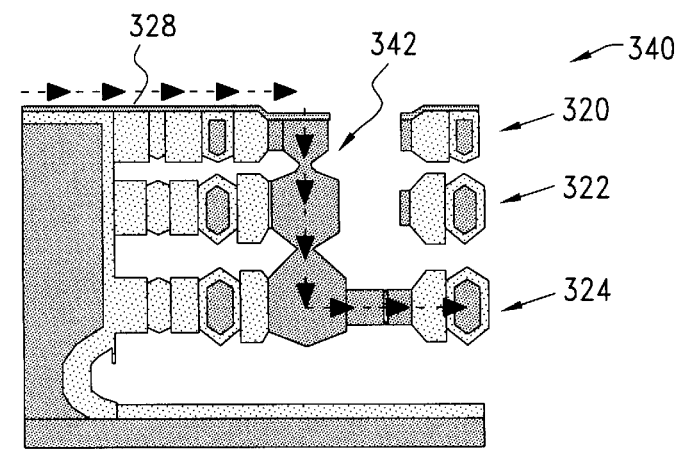

FIG. 9c shows a bottom level contact structure 340. In this level, the inter-level connection segment 342 is now 6 µm wide, connecting all three suspended levels. The isolation segments to the left of the inter-level contact are nominally (CAD-linewidth) 0.8 µm wide, isolating the top and middle level from the interconnected levels. Thus, only the bottom level 324 is connected to this section, which is connected in turn to the Al film 328 on the contact pad through a contact window on the top.

The isolation concept presented here can be generalized to any number of suspended levels and requires only a single lithography step and one metal deposition, regardless of the number of levels. However, the degree of complexity of the structures which need to be fabricated increases rapidly: N levels of suspended structures require 2 N different widths of beam segments for the isolation and contact scheme. The thermal silicon dioxide bridges provide high quality insulation between the suspended levels and the substrate with low leakage currents and high breakdown voltages, but the isolation scheme requires the differences in widths between the various levels to be tightly controlled.

The undercut RIE has to be accurately controlled as well to insure the desired contacting and isolation from level to level. This etch is harder to control than the vertical RIE angle or silicon dioxide thickness, but the process window is also ten times larger because of the greater difference in beam width.

The multiple-level process of the invention, as described above, allows the fabrication of multiple levels of self-aligned, high aspect ratio (HAR) single crystal silicon (SCS) structures, but there are limitations to design freedom on the different suspended levels, for the lateral geometry on each level has to be identical. Moreover, the thick silicon dioxide film covering parts of the levels leads to stress problems, which may have an adverse effect on the mechanical properties and stability of the suspended structures. In accordance with further aspects of the invention, three variations and extensions of the basic process, which address these limitations, are available.

Figure 10:
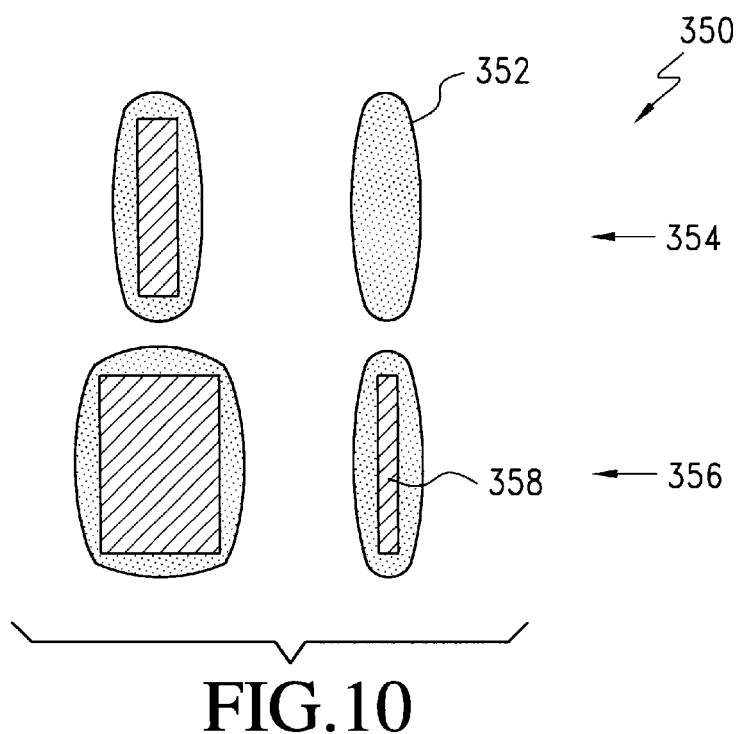
FIGS. 10 and 11 illustrate design variations for a two-level structure.
Figure 11:
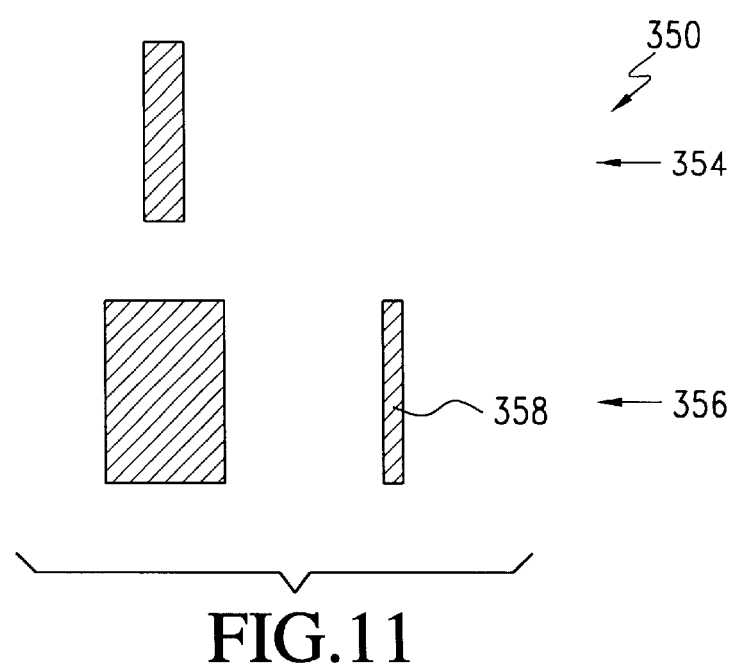
Figure 12:
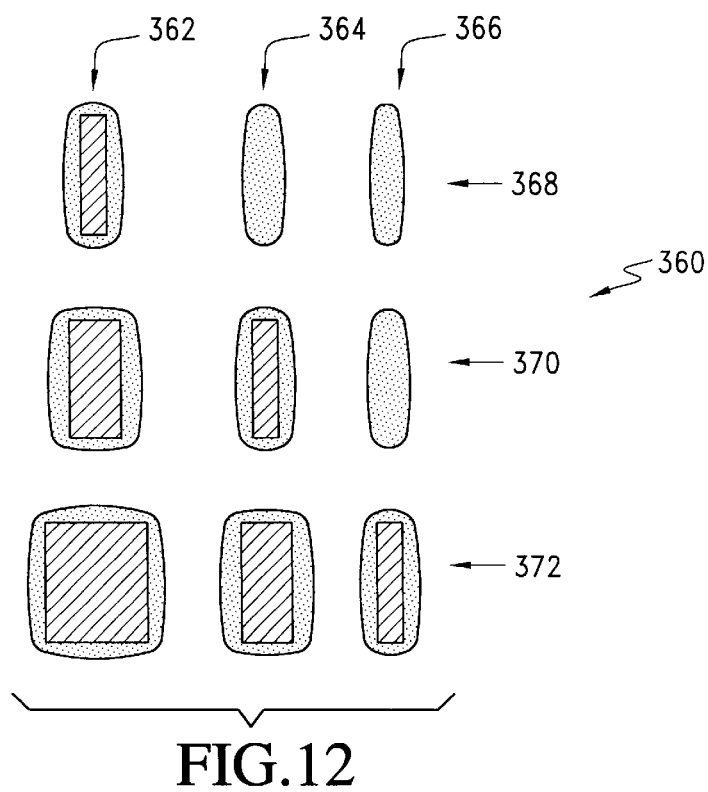
FIGS. 12 and 13 illustrate design variations for a 3-level structure.
Figure 13:
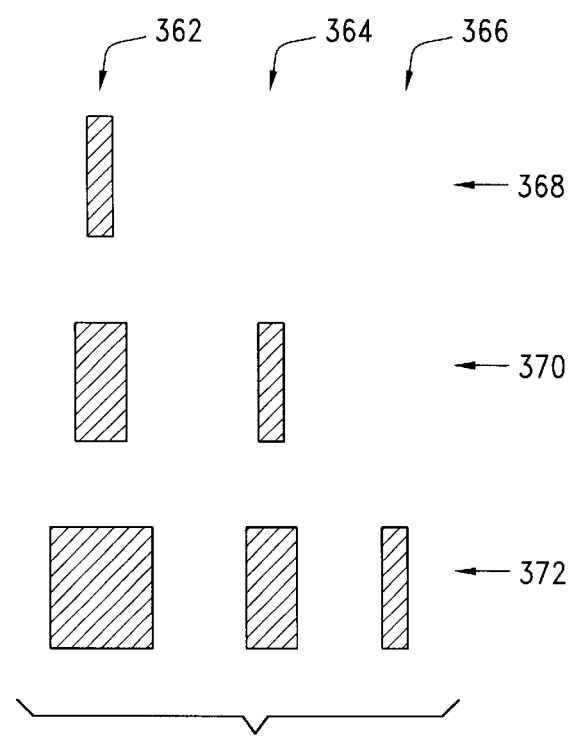

The simplest way to allow variation of the lateral geometry on different levels of a MEM structure can be accomplished by intelligent design and does not require any different or additional processing. It is illustrated in FIG. 10 by a two-level example 350, wherein a thin (nominal 0.8 $\mu$m wide) beam segment 352 is fully oxidized on the upper level 354, but not on the lower level 356. Thus when the structures are exposed to a wet oxide etch the upper level oxide beam 352 is removed while the silicon core 358 of the lower level remains, as illustrated in FIG. 11. This method can be used to generate features on the lower level which do not exist on the upper level, and can also fabricate devices containing structures of different heights. For example, thin (nominal 0.8 $\mu$m) beams would exist only on the lower level, while very wide (nominal 4 $\mu$m) wide beams would exist on both levels and would be twice as tall. These structures can be used, for example, in micromachined electrostatic lenses and actuators. The same concept is extensible to more than two levels, removing any number of levels from the top of the stack, as illustrated at 360 in FIGS. 12 and 13, wherein the thicknesses for beams 362, 364 and 366 in level 368 and their corresponding underlying beams in levels 370 and 372 are selected to permit removal of beams on various layers.

The approach of removing parts of the upper or top level(s) by fully oxidizing and then dissolving them in a wet etch is very simple, but it can only be used to remove parts of the upper level of a two level structure, or the top or the top and middle levels of a three level structure. The lower or bottom level can never be modified in this manner. In addition, the width of the beams which can remain on the lower level is limited to the amount of broadening between levels. A second, more flexible approach to introducing variations between structural levels uses a focused ion beam (FIB), illustrated at 380 in FIGS. 14a and 14b for an upper level MEM beam 382 and in FIGS. 15a and 15b for a lower level MEM beam 384. The MEM beams 382 and 384 are individually modified after the beam fabrication sequence described above has been completed; sections of different levels then are removed selectively by milling or cutting with the FIB 380. Tilting the sample relative to the incident beam allows the removal of the lower level without affecting the upper level, as illustrated in FIG. 15a and 15b. The FIB modification approach to varying the geometry between levels is much more flexible than the wet etch approach described above; it removes the limit on the linewidth of structures which only exist on the lower level, since as any width of upper level structure can be removed arbitrarily. It further allows the selective removal of sections of the lower level and thus makes it possible to fabricate devices with elements which exist on the upper but not the lower level.

Figure 16:
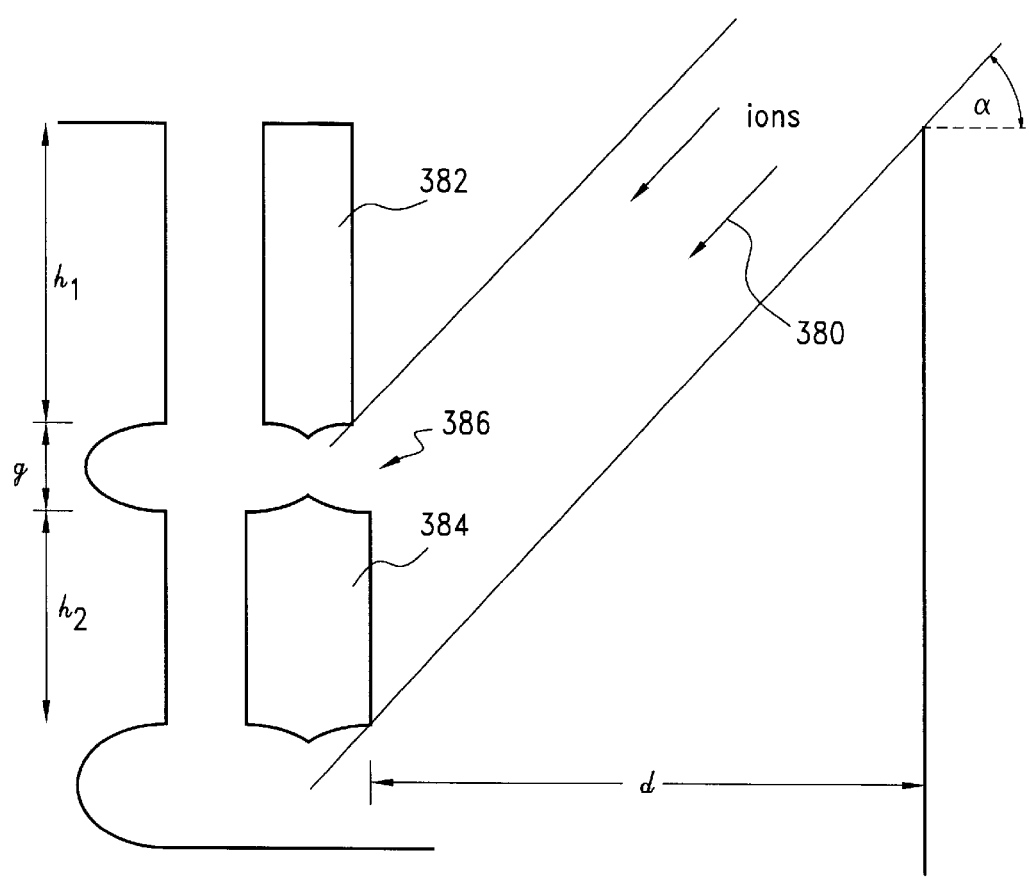
FIG. 16 illustrates the geometrical limitations of the technique of FIGS. 14 and 15.

The removal of lower level elements requires tilting the sample so that the ion beam 380 can strike the lower level structure 384, without damaging the upper level structure 382 above it. As illustrated in FIG. 16, this requires a large enough spacing between adjacent structures to permit the ion beam to reach the structure to be removed, with the limit being determined by the incident angle alpha and the combined height of the suspended levels 382 and 384 and inter-level gaps 386; i.e., the total height of the structures h1+h2+g. This removal technique can not be applied to closely spaced structures such as actuator electrodes.

A third extension of the basic multiple-level process uses selective oxidation to introduce variations between the suspended levels and to reduce the thickness of the sidewall silicon dioxide films. A silicon nitride mask is deposited conformally on a suspended SCS structure and is then patterned with a thick-resist lithography step and etched in hot phosphoric acid. The remaining silicon nitride acts as a mask during the subsequent thermal oxidation step. This method can be applied selectively to each level. The feature size of the oxidized or masked elements is limited by the resolution of the thick-resist lithography step.

Figures 17A, 17B:
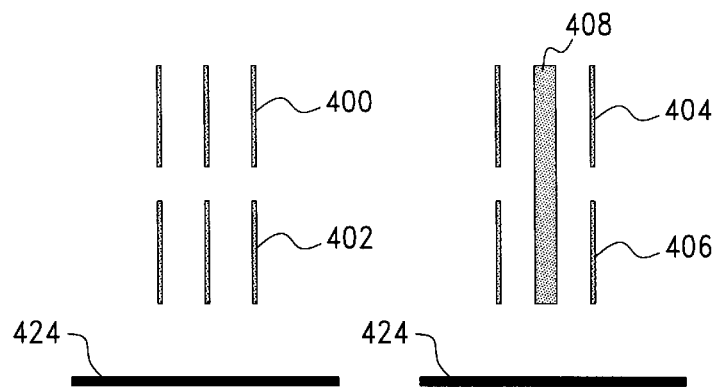
FIGS. 17a–17e illustrate multiple level and multiple height actuators fabricated in accordance with the process of the present invention.
Figures 17C, 17D:
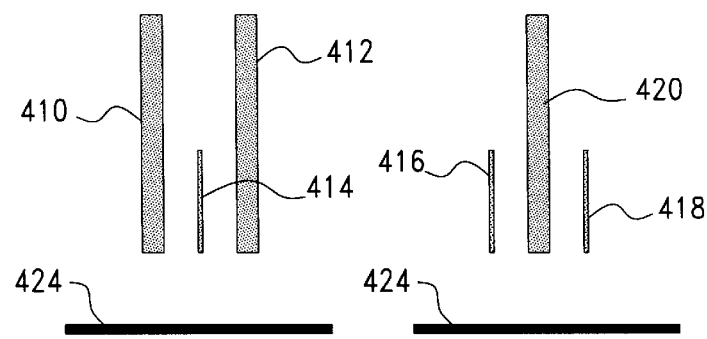
Figure 17E:
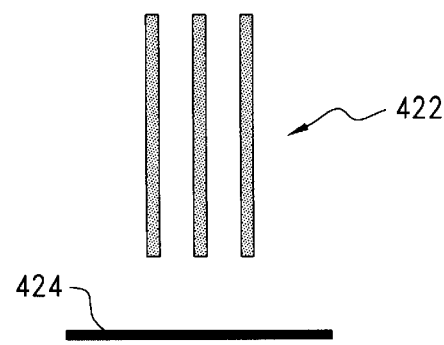

A variety of multiple-level (ML) actuators may be fabricated using the foregoing processes. Such actuators consist of multiple sets of fixed and moving beams which may act as MEM device electrodes, which are electrically isolated from each other. The movable ML actuator electrodes typically are comb-type electrodes attached to a single moving structure which may be up to several levels tall. Variations in the number of levels and the heights of the electrodes allows a number of different actuator designs. FIGS. 17a to 17e illustrate cross-section diagrams of four actuator electrode configurations for a two-level device. FIG. 17a illustrates a comb-type electrode showing two levels of moving electrodes at the center, surrounded on either side by two levels of fixed electrodes; FIG. 17b illustrates two levels 404 and 406 of fixed electrodes, and a single tall electrode 408; FIG. 17c illustrates two tall fixed electrodes 410 and 412 and a short moving electrode 414; and FIG. 17d illustrates short fixed electrodes 416 and 418 and a tall moving electrode 420. FIG. 17e illustrates a conventional, single-level comb actuator 422 having moving and fixed electrodes and which is included for comparison. All these designs may be fabricated using the process of the invention.

The multiple-level (ML) actuators consist of two levels of isolated electrodes, and one (FIG. 17b) or two (FIG. 17a) sets of moving electrodes. Multiple-height (MH) actuators contain only one set of moving and fixed electrodes, but the two sets of electrodes differ in height, preferably by more than a factor of two. For actuators composed of three or more levels of electrodes combinations of ML and MH designs are also possible.

The diagrams in FIG. 17 are scale-drawings of fabricated structures which are examples of these devices. In this example, the lateral spacing between the fingers is 5 $\mu$m, as is the vertical spacing between the two suspended levels. The distance from the lower level to the substrate floor, indicated at 424, is varied from 10 to 20 $\mu$m. The width and height of the electrodes vary depending on the type of electrode, with the regular electrodes, existing on both levels but not connected to each other as in FIGS. 17c and 17d, are 1 $\mu$m wide and 15 $\mu$m tall. The tall electrodes, which span two levels, are 35 $\mu$m tall and 3 $\mu$m wide. Other sizes and configurations are possible in accordance with the invention.

The ML and MH actuators are designed for out-of-plane motion (perpendicular to a wafer surface). Conventional comb-actuators have been shown to generate a vertical force component due to the asymmetry introduced by the substrate below the comb fingers, but the herein-disclosed actuator designs generate a larger vertical force over a greater stroke than the conventional comb drives of comparable dimensions. Furthermore, the ML actuators are bi-directional.

The force vs. displacement characteristics of all the actuator designs in FIG. 17 have been studied by numerical simulation. The simulation results are given per unit length [$\mu$m] of a single moving electrode. The applied bias is 0V or 1V, and the displacement step between the simulated configurations is 1 μm. The calculated forces have been normalized by a factor $F_0$, related to the force $F_p$ generated by a conventional comb-actuator parallel to the surface of a wafer, which is $$F_p = \frac{\varepsilon_0 h V^2}{g}$$

Here V is the applied voltage, h the height of the actuator, g the gap between the electrodes and $e_0$ is the permittivity of free space. The scaling factor is this force, per unit height of the actuator electrode at 1V applied bias:

$$F_0 = 100\frac{\varepsilon_0}{g} = 1.77 \cdot 10^{-4} \left[\frac{\mu N}{\mu m V^2}\right]$$

for an electrode gap of 5 im. Thus the vertical axis of the plots in the following Figures gives the force generated by the actuator configuration (per unit length of electrode) as a percentage of that of the in-plane force of a single-level comb actuator with the same gap width (per unit electrode height).

The multiple-height (MH) actuators are the out-of-plane or z-actuators that most resemble conventional comb actuators. They contain only one set of moving and fixed electrodes each, but the vertical asymmetry and thus the levitation or pull-in force generated is increased relative to that of conventional comb actuators; the height of the fixed and moving electrodes differs preferably by more than a factor of two. As they contain only one set of moving and fixed electrodes, these actuators do not necessarily require a multiple-level contact and isolation scheme and can thus also be implemented using a simplified process.

Figure 18:
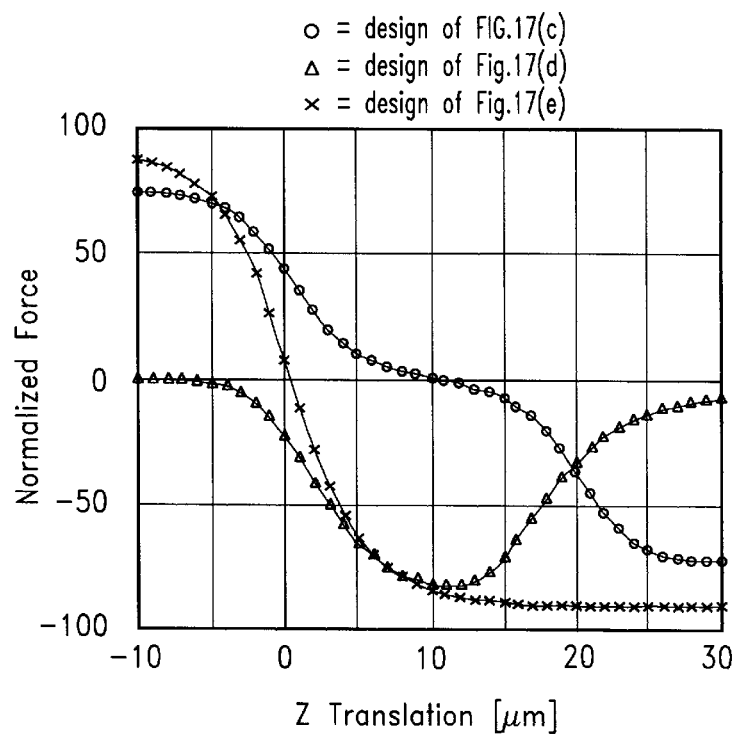
FIG. 18 illustrates force vs. displacement for multiple-height actuators with the moving electrode grounded.

The electrode configurations shown in FIGS. 17c and 17d have been simulated for the two bias configurations of the moving electrodes; namely, grounded and biased. The simulation results for the situation where the moving electrodes are grounded are shown in FIG. 18. This is the most commonly used bias configuration in conventional MEMS for two reasons: it does not require isolation of the moving structure from the substrate, and it does not give rise to a 'parasitic' actuation force between the biased suspended structure and the grounded substrate. However, neither concern is relevant for devices fabricated by the process of the present invention, as it allows for isolation from the substrate and within the suspended structures. Thus, the moving electrodes can be biased while the moving stage is grounded.

FIG. 18 shows the force vs. displacement of the two MH actuator designs and a comparable conventional comb actuator over the full stroke of these actuators. The force varies with displacement for all three actuator designs, unlike for the in-plane comb-drive. The z-force generated by a conventional comb-drive (FIG. 17e) is essentially a restoring force, varying linearly near the equilibrium position (z=0). It is offset from z=0 due to the asymmetry introduced by the ground plane. For large displacements (dz>10 μm) it approaches a constant level.

The design of FIG. 17c creates a larger levitation force up to a displacement of approximately dz=10 μm. At z=10 μm the short moving electrode 414 is centered vertically between the tall fixed electrodes 410 and 412. The position where the force is zero is shifted slightly to a larger z-value by the presence of the substrate ground-plane 424 below the actuator electrodes. As z increases further the force is now downward (pull-in). At z=20 μm, the top of the moving and fixed electrodes are aligned, mirroring the configuration at z=0. The magnitude of the force generated (at z=20 μm) is reduced (from to the value at z=0), as the levitation caused by the substrate counteracts the force generated by the fixed comb fingers.

The design of FIG. 17d generates a downward, or pull-in, force over the entire plotted range. It vanishes as z approaches −10 μm, at which point the moving electrode is centered between the fixed electrodes. The maximum force is generated near z=10 μm, where the overlap between the moving and fixed electrodes is 5 μm, the same as the gap width. As z increases further the generated force drops. This is the same behavior as that observed for in-plane comb actuators as the comb-finger approach and begin to overlap.

Figure 19:
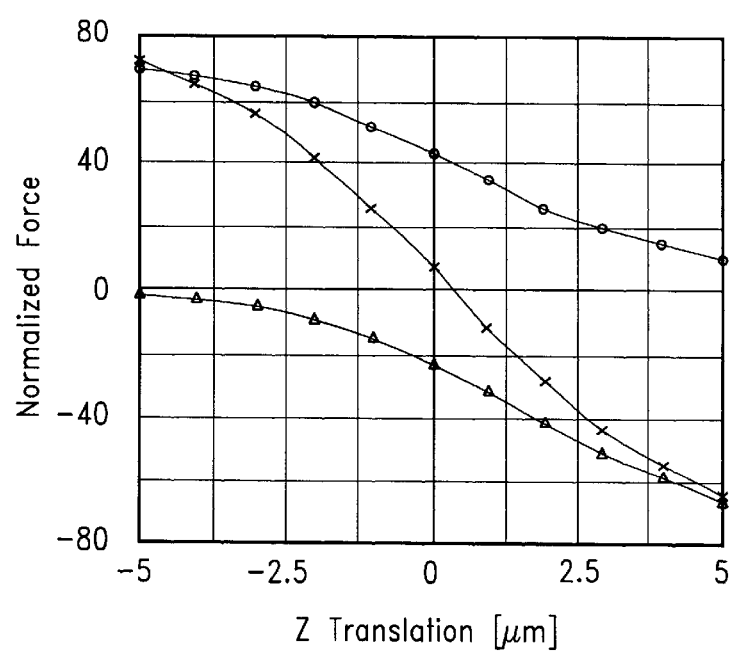
FIG. 19 is an enlarged view of a portion of the graph of FIG. 18.

An expanded view of the region around z=0 is shown in FIG. 19. This is the region that is generally most relevant to actual operation. Over the plotted range (−5 μm<z<5 μm), both MH actuator designs generate larger out-of-plane forces than the conventional comb actuator. Furthermore, the direction of the force they generate does not change, unlike that of the conventional comb actuator.

In most MEMS devices, as exemplified by the device of FIG. 2, the actuators (50, 56) are used to move structures 40 suspended from the substrate by a set of springs 44, 46. These springs exercise a restoring force towards the equilibrium position that the actuator has to overcome in order to deflect the moving stage, i.e. the generated force has to be upward (F>0) for levitation (z>0) and downward (F<0) for pull-in (z<0). Thus there is a useful range of actuation of a motor for the z-values over which it meets the two above criteria. Applying this criterium to the three actuator designs shown in FIGS. 17c, d and e, the useful range of motion for the MH actuators (0 to 5 μm for levitation, 0 to −5 μm for pull-in) is found to be ten times larger than that of a conventional single-level comb-drive with the same dimensions (design of FIG. 17e) (0 to 0.44 μm, levitation only). The force generated by the MH actuators over this range is more than five times larger than that of the conventional comb-actuator. For resonant operation the direction of the force generated should, moreover, not change as the electrodes pass through the equilibrium position. This requirement is met by all three actuator designs.

Figure 20:
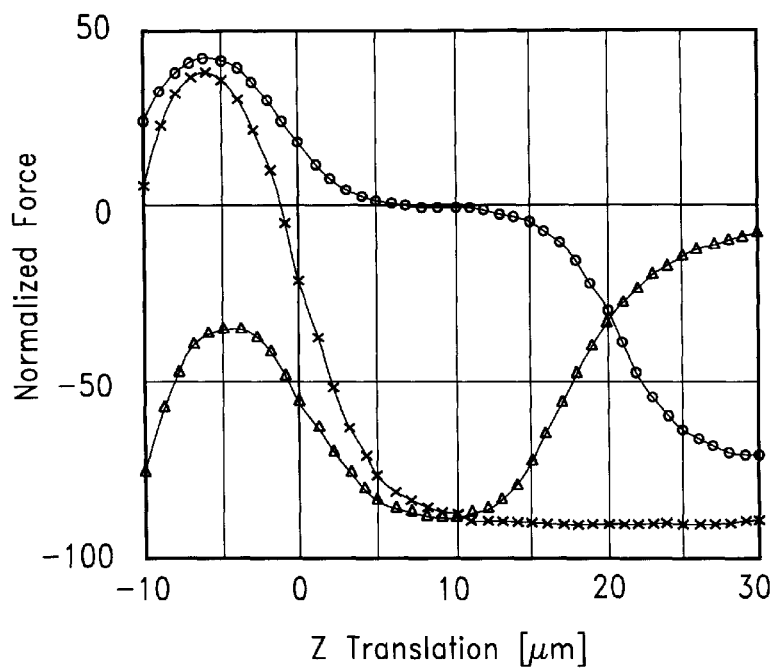
FIG. 20 illustrates force vs. displacement for multiple-height actuators with the moving electrode biased.

The second bias configuration for the MH actuators is to bias the moving electrodes and ground the fixed electrodes. The resulting force vs. displacement characteristics are plotted in FIG. 20. At z>0 the behavior is similar to that shown in FIG. 18 for the moving electrode grounded. As z decreases below −5 μm, however, the force is dominated by the pull-in effect of the grounded substrate on the biased moving electrode. The conventional comb actuator (FIG. 17e) now generates a pull-in force for z>−1.23 μm. The forces generated by the MH actuators have not changed qualitatively; the design of FIG. 17c still generates levitation at z less than approximately 10 μm and pull-in above, but the magnitudes of the forces have changed due to the pull-in effect exerted by the substrate on the biased moving electrode. The design of FIG. 17d generates a pull-in force over the entire plotted range at an increased magnitude compared to the configuration with the moving electrodes grounded.

Figure 21:
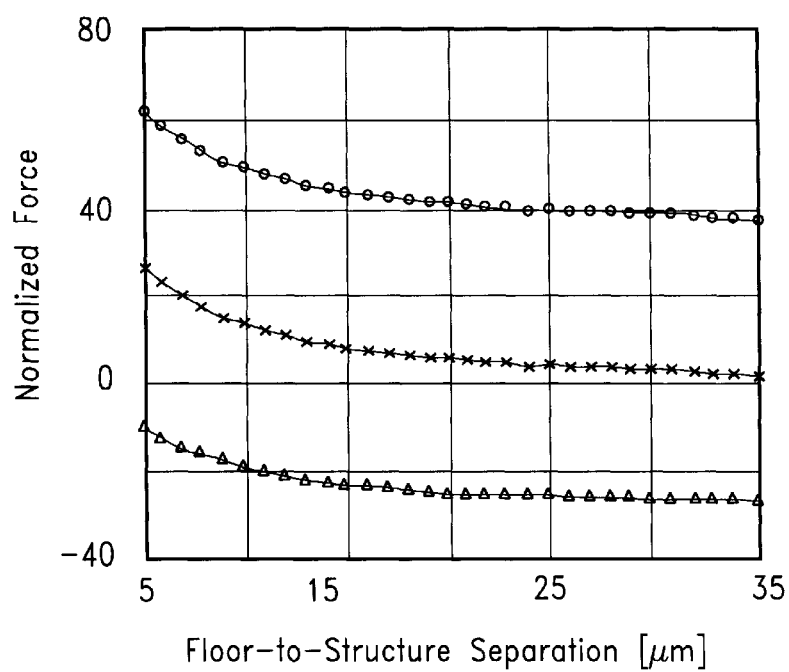
FIG. 21 illustrates the dependence of vertical force on substrate floor to structure separation.

The out-of-plane forces generated by these comb actuator designs depend on the vertical asymmetry of the electrode arrangement. In the case of the conventional comb actuator this asymmetry arises entirely from the presence of the grounded substrate floor. The above simulations show that the substrate floor also has a discernible effect on forces generated in the MH actuator design. This effect is illustrated in FIG. 21, which shows the dependence of the force generated at z=0 on the spacing between the bottom of the moving electrodes and the substrate floor (with the moving electrodes grounded).

For the conventional comb actuator the generated force decreases to zero as the substrate is removed. For the MH levitation actuator of FIG. 17c the force decreases as well, but levels off at approximately 40% of the in-plane comb drive value ($F_0$). For the pull-in MH actuator of FIG. 17d, the force increases with the substrate-to-structure separation and levels off near 25% of $F_0$.

The characterization of the ML actuators is more involved: there are more than two sets of electrodes allowing the simultaneous application of several voltages. This leads to a large number of bias configurations and force vs. displacement characteristics. The generated force depends on the square of the applied voltage-differences and this can not be solved by the superposition of multiple simulation results. There are, however, two essential characteristics of the ML actuators that can not be achieved with conventional electrostatic actuators: first, they illustrate the bi-directional operation of a ML actuator, and second they form of a bi-stable system in conjunction with a restoring spring suspension.

Figure 22:
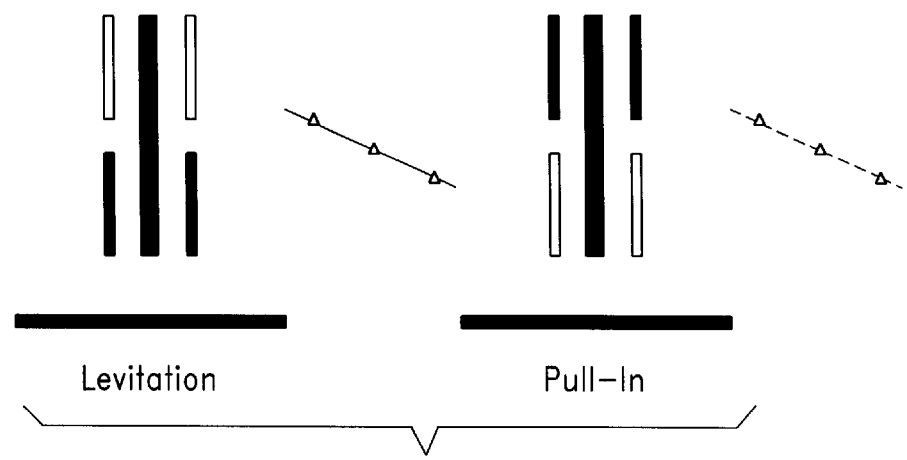
FIGS. 22 and 23 illustrate the bi-directional operation of a first embodiment of a multi-level actuator, showing normalized force vs. displacement for both levitation (solid line) and pull-in (dashed line) operation.
Figure 23:
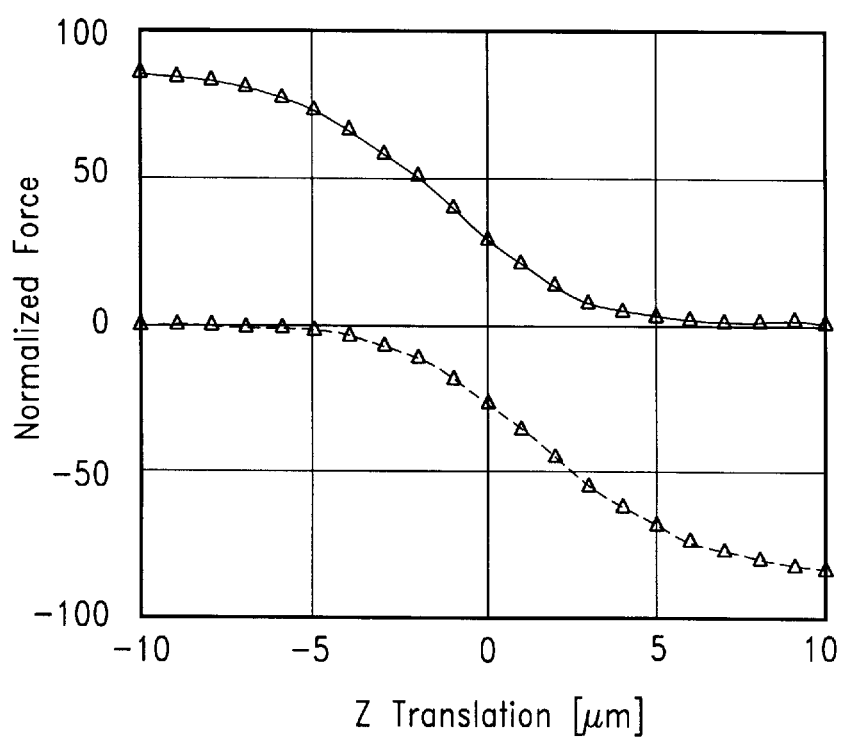

The same ML actuator can generate either a levitation- or a pull-in-force over the same range of z-positions for different electrode bias configurations. This is illustrated in FIGS. 22 and 23 for a two-level actuator of the design of FIG. 17b. FIG. 22 shows the bias configurations for the levitation and pull-in modes, and FIG. 23 shows the force vs. displacement for the range of $-10\ \mu m < z < 10\ \mu m$.

In the levitation mode (solid line in FIG. 23) the upper fixed electrodes are biased while all the other electrodes are grounded. In the pull-in mode (dashed line in FIG. 23) the lower fixed electrodes are biased while all other electrodes are grounded. The generated force (both levitation and pull-in) does not change direction over the entire plotted range and decreases to zero at a z-displacement of approximately 10 $\mu m$. At this point the tall moving electrode is vertically centered between the biased fixed electrodes. These characteristics are similar to the MH drives discussed above, but the generated force is approximately 50% lower.

Figure 24:
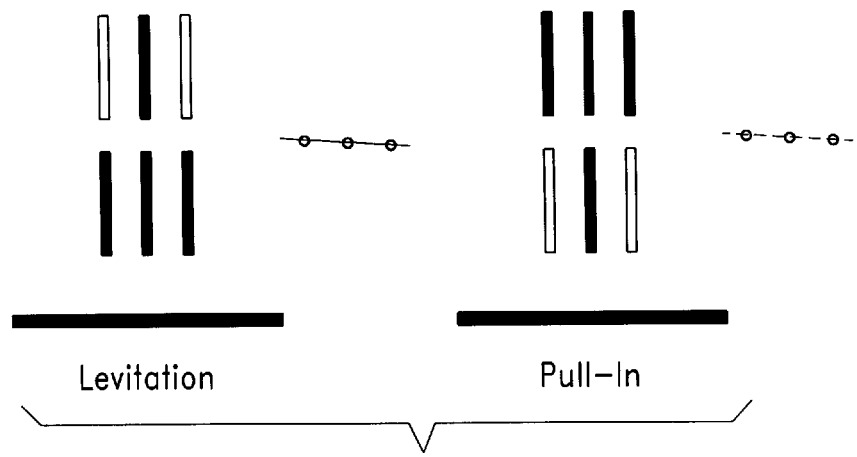
FIGS. 24 and 25 illustrate bi-directional operation of a second embodiment of a multi-level actuator, showing normalized force vs. displacement for both levitation (solid line) and pull-in (dashed line) operation.
Figure 25:
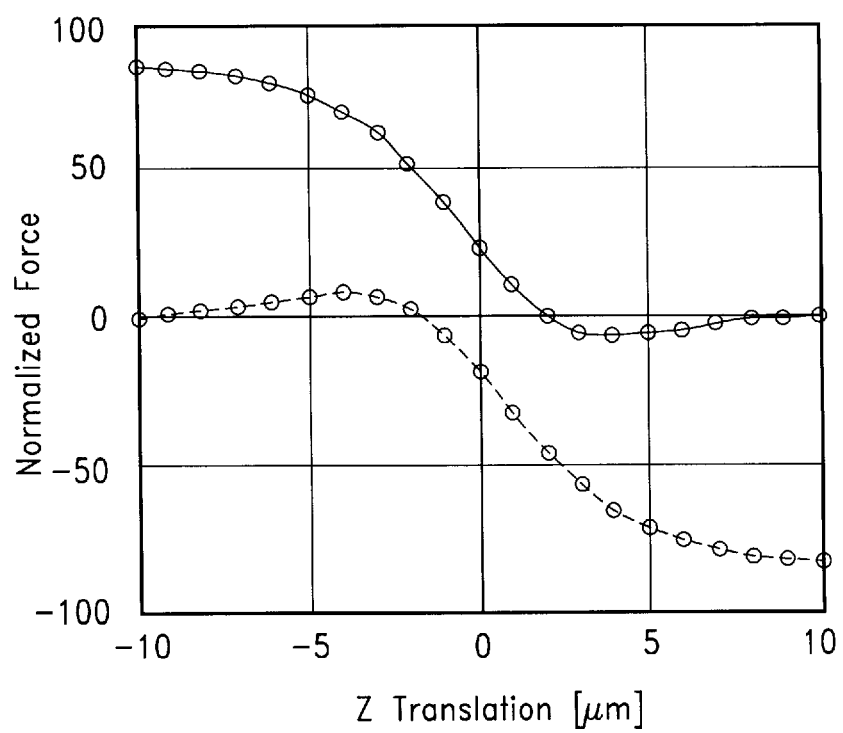

The force vs. displacement relationship for a two-level actuator of the design of FIG. 17a is shown in FIGS. 24 and 25 for both levitation and pull-in configurations. The useful range of actuation of this actuator is much smaller than that of the design of FIG. 17b; the generated force drops more rapidly as |z| increases and the force changes direction at approximately 2 $\mu m$. This effect occurs because the biased fixed electrodes simultaneously exert opposing forces on the two levels of moving electrodes: e.g. in the levitation mode (upper fixed electrodes biased, all others grounded), the upper moving electrode (displaced above the biased fixed electrodes) is pulled downward while the lower moving electrode (below the biased fixed electrodes) is pulled upward. This effect is strongly dependent on the vertical gap between the electrode levels and disappears as this gap vanishes.

Figure 26:
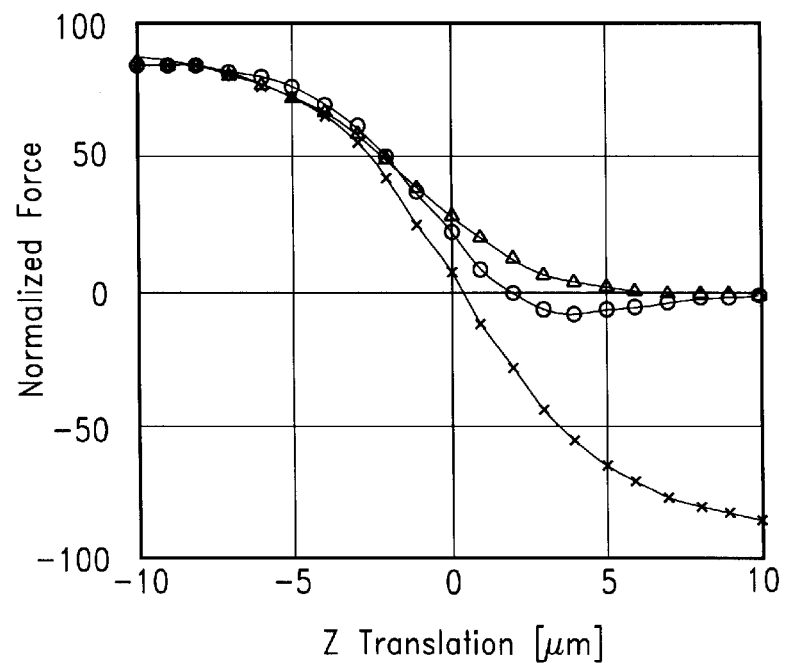
FIG. 26 illustrates a comparison of multiple-level actuator designs, showing normalized force vs. displacement.

In order to facilitate comparison of the actuator designs the levitation mode characteristics have been plotted in FIG. 26 for the ML designs of FIGS. 17a and 17b, and the conventional comb actuator. The force generated by the ML actuators exceeds that of the conventional comb actuator over the entire plotted range. The useful range of actuation is increased by a factor of 4 and 12 for designs (a) and (b), respectively. Over this range the ML actuator force exceeds that of the conventional comb actuator a factor of 2.5 and more.

Figure 27:
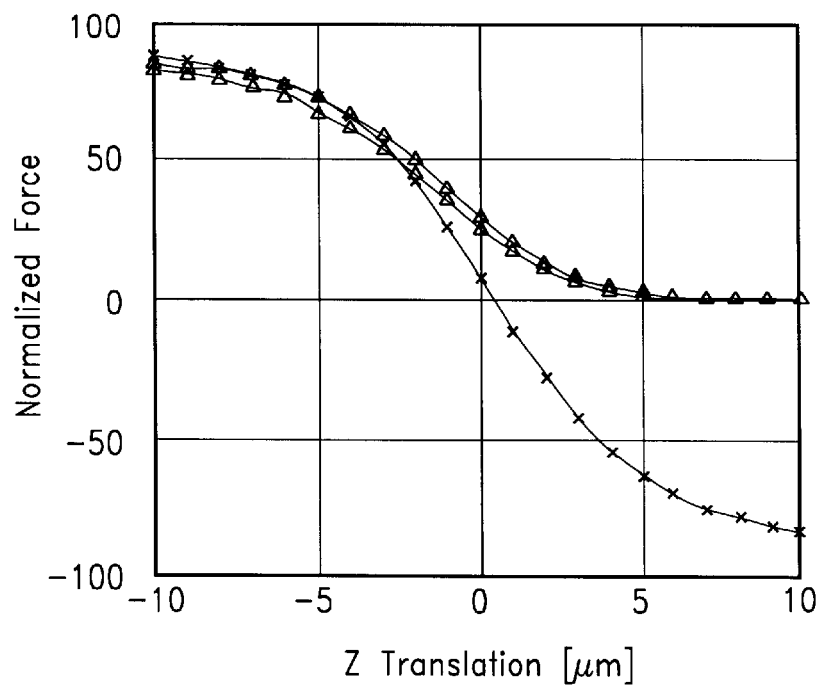
FIG. 27 illustrates a comparison of push- and pull-modes of the bi-directional actuator of FIG. 22.

The force vs displacement characteristic of bi-directional actuation of a multiple level actuators such as in FIG. 17(b) is shown in FIG. 27. The plot of the pull-in curve has been inverted through the origin to illustrate its similarity in the force vs. displacement characteristic to the levitation mode. The two traces are nearly identical, with the pull-in mode slightly smaller in magnitude. This reduction is due to the levitation effect of the substrate below the comb electrodes, as was discussed above for the MH actuators.

Figure 28A:
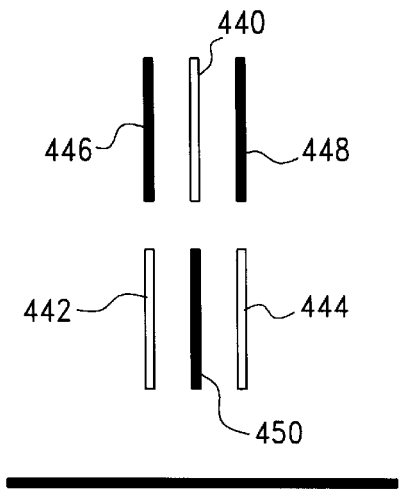
FIGS. 28a and 28b illustrate normalized force vs. displacement for a two-level bistable system.
Figure 28B:
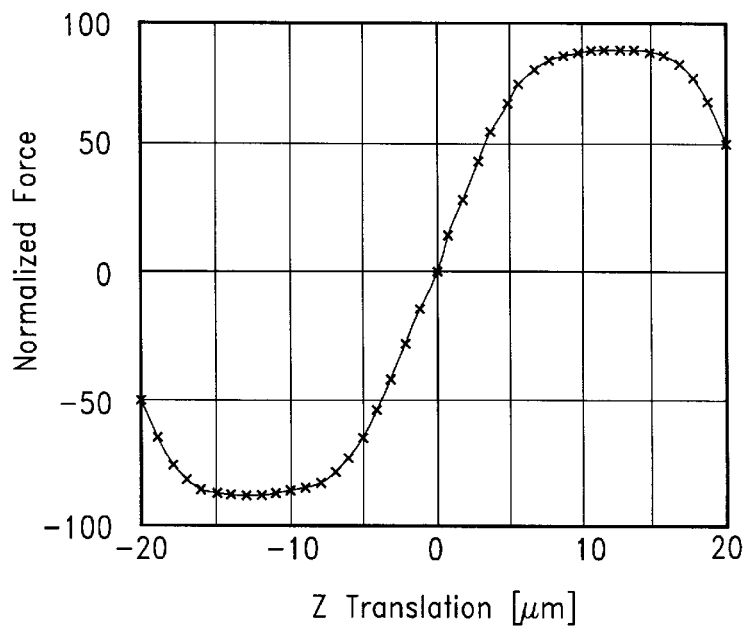

Besides operating as a bidirectional actuator the ML design of FIG. 17a can also be used to create a bi-stable system. FIG. 28(a) illustrates the bias configuration: the upper moving electrode 440 and the lower fixed electrodes 442 and 444 are biased, all other electrodes are grounded. The upper fixed electrodes 446 and 448 exert an upward force on the lower moving electrode 450 and the lower fixed electrodes 442 and 444 pull downward on the upper moving electrode 440. At the equilibrium position these forces balance. A small out-of-plane perturbation in either direction causes the force in the same direction to increase and the opposing force to decrease, which leads to a further increase in deflection. The resulting force vs. displacement curve is plotted in FIG. 28b.

Figure 29:
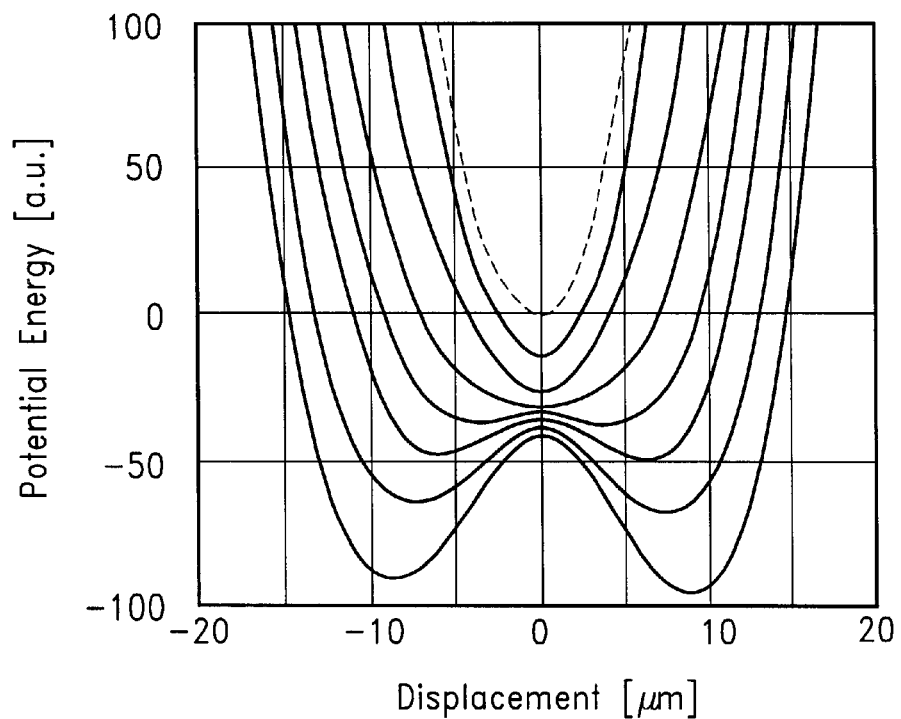
FIG. 29 illustrates potential energy vs. displacement for a spring-actuator system, the dotted line representing no applied force.

The combination of this actuator configuration with a restoring spring suspension allows the formation of a bi-stable system. The spring adds a linear restoring force. The potential energy of the combined system for a number of applied voltages is shown in FIG. 29. When no force is applied (V=0) the potential energy trace is a parabola, corresponding to the spring suspension. As the applied voltage (and thus force) is increased, this combined parabola broadens—the actuator acts initially as a spring with a negative spring constant. As the voltage is increased further it eventually leads to the formation of a double-well potential.

Figure 30A:
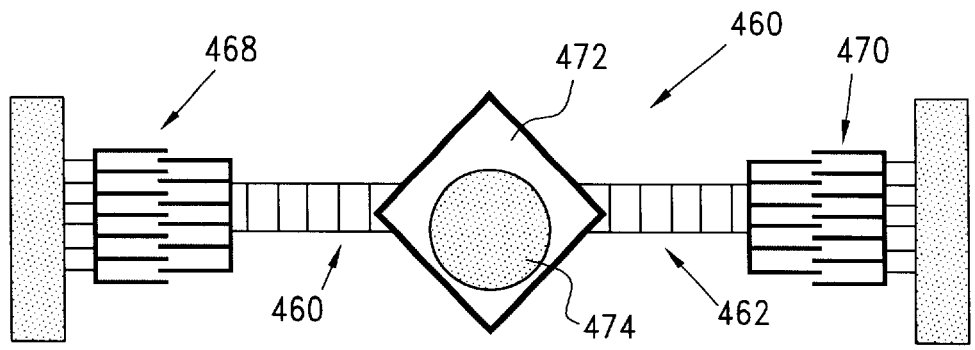
FIGS. 30a and 30b are diagrammatic top plan views of a multiple-level fiber Clamp-Alignment device, FIG. 30a showing a self-aligned initial position with no displacement of levels and FIG. 30b showing the relative displacement of upper and lower levels and the resultant alignment of a device being clamped.
Figure 30B:
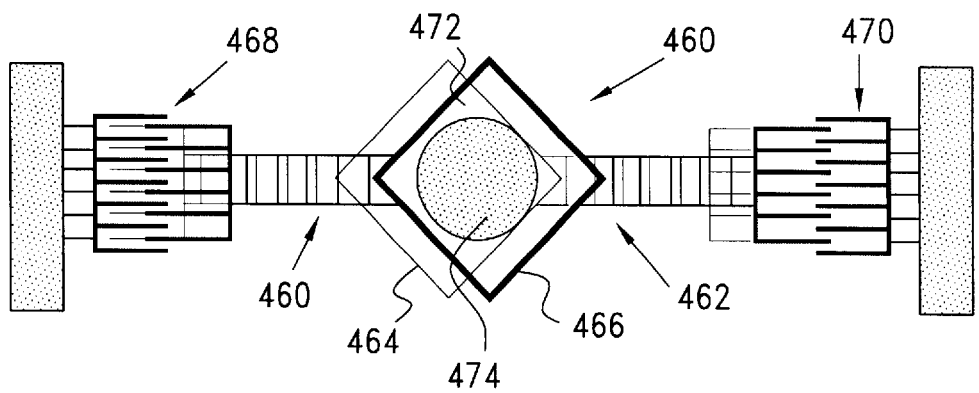

A novel clamp-alignment structure 460 fabricated by the process of the invention is illustrated in FIGS. 30a and 30b. This is a multiple-level device that consists of two identical upper and lower stages 460 and 462 with diamond-shaped openings 464 and 466, respectively at the center. The stages are anchored to the substrate by a conventional folded-beam suspension (not shown) and are displaced in the plane of the wafer by comb actuators 468 and 470. At no applied force (0V) the two stages are self-aligned to each other. Applying a voltage to either actuator translates the corresponding stages to the left or right, decreasing the size but maintaining the shape of the overlap region 472 between the diamond-shaped openings in the stages. When an external element 474 such as an optical fiber or a post on top of a second chip is inserted into the stage opening 472, it is aligned in the y-direction by the relative offset of the diamond shapes, and in the x-direction by the displacement of the moving stages.

A simpler, but more limited version can also be implemented using a moving top and a stationary bottom level. In this case the upper level diamond-shaped aperture is used to push the external element across until it rests against the fixed lower level diamond aperture.

The diagonal of the diamond-shaped openings 464 and 466 determines the maximum diameter object 474 which can be clamped and aligned in this manner ($d_{max}$=0.71F). The minimum-diameter object that can be aligned then depends on the range of motion $\Delta x_{max}$ of the comb actuators ($d_{min}$=F$-2\Delta X_{max}$). Optical fibers and supports of microfabricated structures are likely candidates for alignment using this structure. Typical values for their diameters range from 50 $\mu m$ to 200 $\mu m$. This translates into a large aperture diameter (100–300 $\mu m$) and large required stage displacement (25–100 $\mu m$).

The suspension stiffness must be linear for large displacements and very compliant in the direction of the desired displacement to minimize the required actuation voltage, and at the same time very stiff in the perpendicular directions to avoid misalignment and in particular failure of the comb actuators.

This leads to the following possible design choices for the folded-spring suspension system used. The spring beams are made very long to minimize the non-linear effects at large deflections. Their width is limited by the process to less than 3 μm. This requires the use of several springs in parallel to achieve the desired stiffness. Selective increases in the stiffness in the directions perpendicular to the desired displacement are limited. $k_z$ increases with the height of the structures. The ratio of the in-plane spring constants $k_x/k_y$ scales with the square of the ratio w/l; thus, increasing the length of the beams and the number of beams in parallel to maintain $k_x$ increases this ratio. The suspension design parameters for three different aperture sizes are summarized in Table 1.

TABLE 1

Design parameters for clamp structure suspension
(all lengths in μm, stiffness in N/m)

| F | $W_1$ | $w_2$ | l | $k_x$ | $k_y$ | $k_z$ |
|---|---|---|---|---|---|---|
| 40 | 1.5 |  | 250 | 1.64 | 4100 | 72.9 |
| 40 |  | 1.7 | 250 | 2.39 | 5968 | 82.7 |
| 100 | 1.5 |  | 300 | 0.95 | 3420 | 42.2 |
| 100 |  | 1.7 | 300 | 1.38 | 4979 | 47.8 |
| 100/200 | 1.5 |  | 350 | 0.60 | 2940 | 26.7 |
| 100/200 |  | 1.7 | 350 | 0.87 | 4280 | 30.1 |
| 200 | 1.5 |  | 400 | 0.40 | 2560 | 17.5 |
| 200 |  | 1.7 | 400 | 0.58 | 3712 | 20.1 |

Figure 31A:
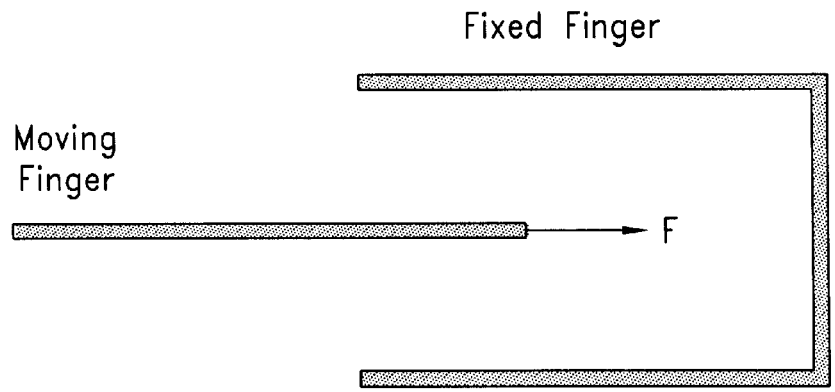
FIGS. 31a and 31b are diagrammatic illustrations of the lateral instability of comb-drive actuators, FIG. 31a showing a moving finger aligned at center and FIG. 31b showing a moving finger off-center.
Figure 31B:
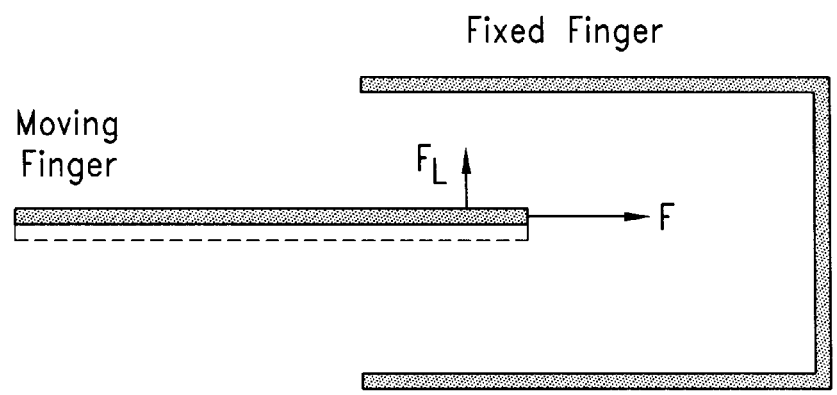

The actuators driving the stages need to provide a large force and operate over a long range of motion. Comb actuators meet these design criteria. The high force requires a large number of combs and a small gap between the fixed and moving electrodes. The long range of motion requires long electrode fingers. This raises the issue of stability of these actuators, which is illustrated in FIG. 31.

The lateral force in a comb actuator is zero at the center of the gap (FIG. 31a) but for slight displacements in y—perpendicular to the fingers (FIG. 31b)—it increases rapidly. The lateral force FL is given by $$F_L(y) = 2\varepsilon_0 V^2 h(x_0 + \Delta x)\frac{gy}{(g^2 + y^2)^2}$$

where V is the voltage applied to the actuator $_1x_0$ the initial electrode overlap at zero displacement, $\Delta x$ the displacement in x, and g the gap between the electrodes. This can also be expressed as a (negative) spring constant of the actuator $k_{y,act}$ $$h_{y,act} = -\frac{2\varepsilon_0 V^2 h(x_0 + \Delta x)}{g^3}$$

This equation shows that the actuator gap has a much stronger effect on the destabilization of the perpendicular mode than the increase in generated force. Thus in order to obtain the required force it is better to increase the number of fingers than reduce the gap. The actuator design parameters chosen for three different aperture size stages and displacement ranges are summarized in Table 2.

TABLE 2

Design parameters for clamp structure actuators

| N | g | F(V = 30V) | F(V = 70V) |
|---|---|---|---|
| 200 | 5 | 3.2 | 8.8 |
| 400 | 5 | 63.4 | 17.6 |
| 400 | 8 | 4 | 11 |
| 600 | 8 | 6 | 16.5 |
| 600 | 10 | 4.8 | 13.2 |
| 800 | 10 | 6.4 | 17.6 |

Although the invention has been described in terms of preferred embodiments, it will be understood that its true spirit and scope is limited only by the following claims.

What is claimed is:

1. A microelectromechanical structure comprising:
   a substrate having a cavity formed by etching through a single mask to produce a two-level suspended structure in said substrate, the structure including:
   a first level incorporating a first clamp stage suspended in said substrate and movable by a first set of actuators;
   a second level incorporating a second clamp stage suspended in said substrate and movable independently of said first stage by a second set of actuators, said first and second levels being substantially identical and vertically self-aligned, said first and second sets of actuators being operable in opposite directions to shift one of said first and second clamp stages with respect to the other.

2. The structure of claim 1, wherein said substrate lies in a horizontal plane and said first and second clamp stages are movable in planes parallel to each other and to the plane of said substrate.

3. The structure of claim 2, wherein said first and second sets of actuators are comb actuators, and wherein at least one of said sets of actuators is operable to cause one of said stages to move horizontally with respect to the other of said stages.

4. The structure of claim 3, wherein each of said stages incorporates an aperture, said apertures being vertically aligned when said sets of actuators are at rest, the relative motion of said stages displacing one aperture with respect to the other.

5. The structure of claim 2, wherein each of said stages incorporates an aperture, said aperture being vertically aligned when said stages are at rest to provide an opening through said first and second stages, and wherein movement of one stage with respect to the other decreases the size of said through opening.

6. A multilevel microelectromechanical structure, comprising:
   a first vertical electrode having a first vertical height extending through a first structure level;
   a second vertical electrode spaced horizontally from said first electrode and having a second vertical height extending through said first structure level and through a second structure level to provide vertical assymetry, said electrodes being energizable to produce relative vertical motion of one electrode with respect to the other.

7. The structure of claim 6, wherein said height of said second electrode is at least twice the height of said first electrode.

8. The structure of claim 6, wherein said first electrode is included in a set of spaced, parallel, electrodes each having said first height.

9. The structure of claim 6, wherein said second electrode is included in a set of spaced parallel electrodes each having said second height.

10. The structure of claim 6, wherein one of said electrodes is fixed and the other of said electrodes is movable.

11. The structure of claim 6, wherein said first electrode is included in a first set of spaced, parallel electrodes each having said first height and said second electrode is included in a second set of spaced, parallel electrodes each having said second height, said electrodes being interleaved to form a comb-type actuator.

12. The structure of claims 11, further including a bias voltage selectively applied to said electrode sets to cause one set of electrodes to move vertically with respect to the other.

13. The structure of claim 12, wherein one of said sets of electrodes is fixed and the other of said sets is vertically movable, whereby said sets provide a vertically displaceable actuator.

14. The structure of claim 1, further including additional levels of self-aligned, suspended structures.

15. The structure of claim 1, wherein said self-aligned, suspended clamp stages are aligned to a feature on the substrate.

16. The structure of claim 15, wherein the feature on the substrate is an aperture.

17. The structure of claim 6, further including additional suspended structures of varying heights.

18. The structure of claim 6, wherein the electrodes, when energized, produce a vertical force which is greater than that achieved by a comparable structure employing electrodes of identical height.

19. The structure of claim 6, wherein the electrodes, when energized, produce a vertical force in a direction of displacement from an equilibrium position, the range of displacement being greater than that achieved by a comparable structure employing electrodes of identical height.

20. A multilevel microelectromechanical structure, comprising:
a first set of electrodes spaced horizontally and having a first vertical height extending through a first structure level;
a second set of electrodes self-aligned horizontally and spaced vertically from said first set of electrodes and having a second vertical height extending through said second structure level;
said second set of electrodes being mechanically attached to but electrically insulated from said first set of electrodes;
both sets of electrodes being energizable to produce relative horizontal or vertical motion of one electrode with respect to the other.

21. The structure of claim 20, comprising three or more sets of electrodes, aligned to each other horizontally and spaced from each other vertically.

22. The structure of claim 20, wherein the electrodes, when electrically energized, produce a vertical force which is greater than that achieved by a comparable structure employing only a single level of electrodes of the combined height.

23. The structure of claim 20, wherein the electrodes, when electrically energized, produce a vertical force in a direction of displacement from the equilibrium position over a greater range of displacement than that achieved by a comparable structure employing only a single level of electrodes of the combined height.

24. The structure of claim 20, wherein said sets of electrodes are energizable to produce a bidirectional vertical actuator, said electrodes being energized by a variation of electrode bias conditions.

25. The structure in claim 20, further including means to bias said sets of electrodes to produce a multi-stable device with several stable equilibria determined by the biasing conditions of the electrodes 26. The device of claim 25, where the multi-stable device is produced by applying bias voltages as follows:
a first voltage is applied in an inner electrode on an upper level and an outer electrode on a lower level; and
a second voltage is applied to an outer electrode on the upper level and an inner electrode on the lower level.

27. A microelectromechanical structure, comprising:
a substrate having a cavity formed by etching through a single mask to produce a multi-level structure;
a first level released stage suspended in the cavity in said substrate;
a first set of actuators connected to said first level clamp stage for moving said clamp stage;
a second level clamp stage on said substrate substantially identical to and vertically self-aligned with said first level clamp stage, said first and second level clamp stages being relatively movable.

28. The structure of claim 27, wherein said stages lie in parallel planes.

29. The structure of claim 28, wherein said stages incorporate apertures which are vertically aligned to provide a through aperture when said stages are at rest, and wherein relative movement of said stages along said parallel planes decreases the size of said through opening.

30. The structure of claim 28, wherein said second level clamp stage is fixed to said substrate.

31. The structure of claim 28, wherein said second level clamp stage is released and suspended in said cavity, and further including a second set of actuators connected to move said second level clamp stage.

* * * * *